(12) United States Patent
Carey et al.

(10) Patent No.: US 7,833,388 B2
(45) Date of Patent: Nov. 16, 2010

(54) END POINT DETECTION FOR DIRECT ION MILLING TO INDUCE MAGNETIC ANISOTROPY IN A MAGNETIC LAYER

(75) Inventors: Matthew Joseph Carey, San Jose, CA (US); Jeffrey Robinson Childress, San Jose, CA (US); Stefan Maat, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 998 days.

(21) Appl. No.: 11/615,865

(22) Filed: Dec. 22, 2006

(65) Prior Publication Data

US 2007/0138002 A1    Jun. 21, 2007

Related U.S. Application Data

(63) Continuation of application No. 11/542,086, filed on Oct. 2, 2006, now Pat. No. 7,446,984, which is a continuation-in-part of application No. 11/304,033, filed on Dec. 14, 2005, now Pat. No. 7,529,066.

(51) Int. Cl.
*C23C 14/34* (2006.01)

(52) U.S. Cl. ............ 204/192.34; 204/192.33; 216/59; 216/60; 216/66; 216/72; 216/74; 216/75; 216/77

(58) Field of Classification Search ............ 204/192.34, 204/192.33; 216/59, 60, 66, 72, 74, 75, 77
See application file for complete search history.

(56) References Cited

U.S. PATENT DOCUMENTS

2005/0003561 A1 * 1/2005 Drewes .................. 438/3

* cited by examiner

*Primary Examiner*—Rodney G McDonald
(74) *Attorney, Agent, or Firm*—Zilka-Kotab, PC

(57) ABSTRACT

A method for manufacturing a magnetic layer with a magnetic anisotropy. The method includes an endpoint detection process for determining an end point to carefully control the final thickness of the magnetic layer. The method includes depositing a magnetic layer and then depositing a sacrificial layer over the magnetic layer. A low power angled ion milling is then performed until the magnetic layer has been reached. The angled ion milling can be performed at an angle relative to normal and without rotation in order to form an anisotropic surface texture that induces a magnetic anisotropy in the magnetic layer. An indicator layer may be included between the magnetic layer and the sacrificial layer in order to further improve endpoint detection.

24 Claims, 34 Drawing Sheets

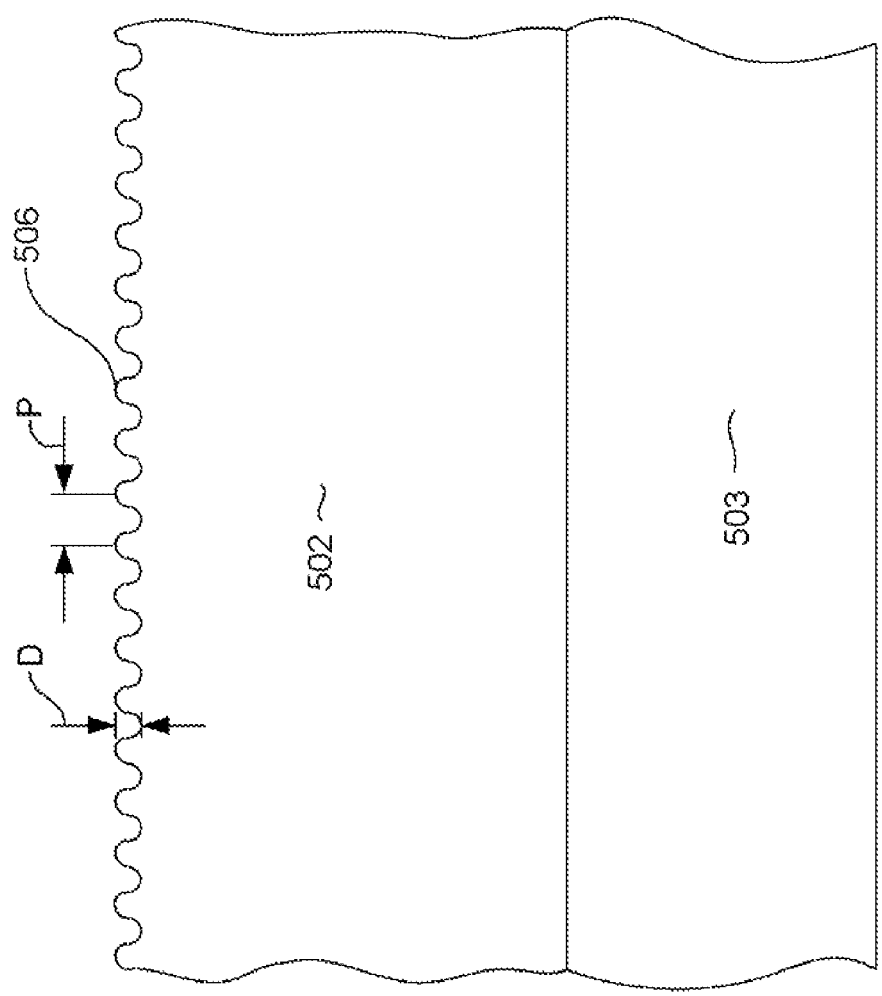

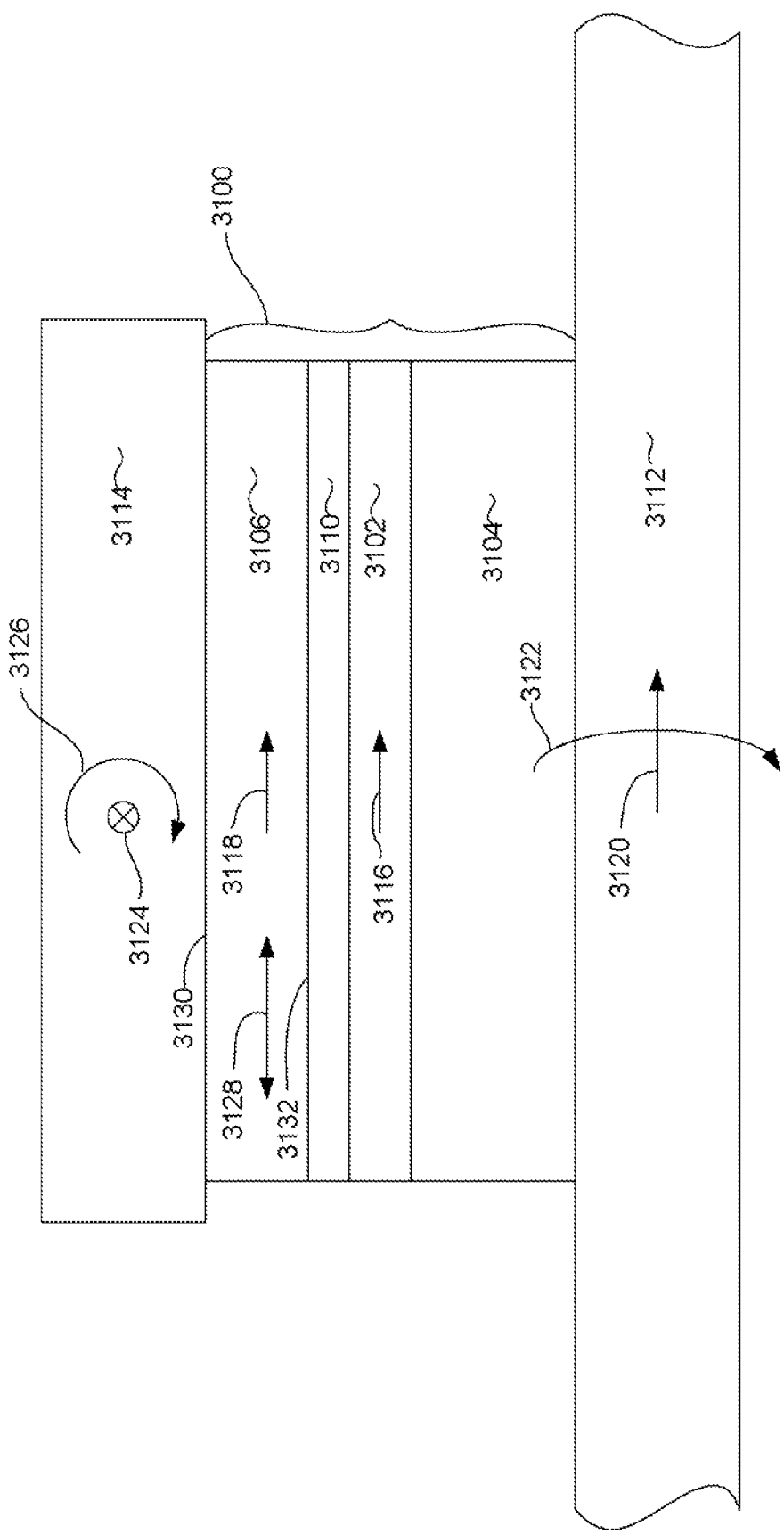

END POINT DETECTION FOR DIRECT ION MILLING TO INDUCE MAGNETIC ANISOTROPY IN A MAGNETIC LAYER

This application is a continuation of commonly assigned U.S. patent application Ser. No. 11/542,086 entitled MAGNETIC RANDOM ACCESS MEMORY (MRAM) HAVING INCREASED REFERNCE LAYER ANISOTROPY THROUGH ION BEAM ETCH OF MAGNETIC LAYERS, filed Oct. 2, 2006, now U.S. Pat. No. 7,446,984 which itself a Continuation in Part of commonly assigned U.S. Patent Application entitled MAGNETORESISTIVE SENSOR HAVING MAGNETIC LAYERS WITH TAILORED MAGNETIC ANISOTROPY INDUCED BY DIRECT ION MILLING, application Ser. No. 11/304,033 Filed Dec. 14, 2005, now U.S. Pat. No. 7,529,066 both of which are hereby incorporated by reference.

FIELD OF THE INVENTION

The present invention relates to magnetoresistive field sensors and more particularly to a sensor having magnetic layers with strong magnetic anisotropy formed by anisotropic texturing of the layer surface through ion milling.

BACKGROUND OF THE INVENTION

The heart of a computer's long term memory is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider toward the surface of the disk and when the disk rotates, air adjacent to the surface of the disk moves along with the disk. The slider flies on this moving air at a very low elevation (fly height) over the surface of the disk. This fly height is on the order of nanometers. When the slider rides on the air bearing, the write and read heads are employed for writing magnetic transitions to and reading magnetic transitions from the rotating disk. The read and write heads are connected to processing circuitry that operates according to a computer program to implement the writing and reading functions.

In a typical design, the write head includes a coil layer embedded in first, second and third insulation layers (insulation stack), the insulation stack being sandwiched between first and second pole piece layers. A gap is formed between the first and second pole piece layers by a gap layer at an air bearing surface (ABS) of the write head and the pole piece layers are connected at a back gap. Current conducted to the coil layer induces a magnetic flux in the pole pieces which causes a magnetic field to fringe out at a write gap at the ABS for the purpose of writing the aforementioned magnetic impressions in tracks on the moving media, such as in circular tracks on the aforementioned rotating disk.

In recent read head designs, a spin valve sensor, also referred to as a giant magnetoresistive (GMR) sensor, has been employed for sensing magnetic fields from the rotating magnetic disk. This sensor includes a nonmagnetic conductive layer, hereinafter referred to as a spacer layer, sandwiched between first and second ferromagnetic layers, hereinafter referred to as a pinned layer and a free layer, both of which can be made up by a plurality of layers. First and second leads are connected to the spin valve sensor for conducting a sense current therethrough. The magnetization of the pinned layer is pinned substantially perpendicular to the air bearing surface (ABS) and is relatively insensitive to applied magnetic fields. The magnetic moment of the free layer is biased substantially parallel to the ABS, but is free to rotate in response to external magnetic fields. In the following substantially parallel means closer to parallel than perpendicular where substantially perpendicular means closer to perpendicular than parallel. The magnetization of the pinned layer is typically pinned by exchange coupling with an antiferromagnetic layer.

For a current in plane (CIP) spin-valve sensor, the thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to $\cos \Theta$, where $\Theta$ is the angle between the magnetizations of the pinned and free layers. Since $\Theta$ is near 90 degrees at zero field, the resistance of the spin valve sensor (for small rotations of the free layer from 90 degrees) changes proportionally to the magnitudes of the magnetic fields from the rotating disk. When a sense current is conducted through the spin valve sensor, resistance changes cause potential changes that are detected and processed as read-back signals.

When a spin valve sensor employs a single pinned layer it is referred to as a simple spin valve. When a spin valve employs an antiparallel (AP) pinned layer it is referred to as an AP pinned spin valve. An AP pinned spin valve includes first and second magnetic layers separated by a thin nonmagnetic coupling layer such as Ru or Ir. The thickness of the coupling layer is chosen so as to antiparallel couple the magnetic moments of the ferromagnetic layers of the pinned layer. A spin valve is also known as a top or bottom spin valve depending upon whether the pinning layer is at the top (formed after the free layer) or at the bottom (before the free layer).

Magnetization of the pinned layer is usually fixed by exchange coupling one of the ferromagnetic layers (AP1) with a layer of antiferromagnetic material such as PtMn. While an antiferromagnetic (AFM) material such as PtMn does not in and of itself have a net magnetic moment, when exchange coupled with a magnetic material, it can strongly pin the magnetization of the ferromagnetic layer.

A current in plane (CIP) spin valve sensor is located between first and second nonmagnetic electrically insulating read gap layers and the first and second read gap layers are located between ferromagnetic first and second shield layers. In a merged magnetic head a single ferromagnetic layer functions as the second shield layer of the read head and as the first pole piece layer of the write head. In a piggyback head the second shield layer and the first pole piece layer are separate layers.

The ever increasing demand for greater data rate and recording density has lead a push to develop sensors having ever decreasing dimensions, such as decreased track-width and stripe height. However, as described above, in order for a magnetoresistive sensor to operate as desired, various layers such as the free and pinned layers must have their magnetic domains oriented in desired directions. For example, the free layer must remain biased in a direction substantially parallel with the ABS, while the pinned layer must have a magnetization that remains pinned in a desired direction substantially perpendicular to the ABS. As sensors become smaller, the ability to maintain these magnetic states diminishes greatly. Free layers lose biasing, becoming unstable, and pinned layer magnetizations can flip, a situation that leads to amplitude flipping. Both of these situations render the sensor unusable. A technique for generating a magnetic anisotropy in any desired direction in the various layers would greatly facilitate sensor robustness.

In a similar manner, the performance of other components of a magnetic recording system would be greatly improved if a magnetic anisotropy could be generated and could be oriented in any desired direction. For example, the performance of a magnetic write element, magnetic shields or a magnetic medium could be greatly improved if a technique existed for orienting a magnetic anisotropy in a desired direction in such devices. Likewise, the performance of magnetic memory cells that incorporate magnetoresistive memory elements can be greatly improved if a magnetic anisotropy could be generated and could be oriented in any desired direction.

Therefore, there remains a need for a technique for generating a magnetic anisotropy in a magnetic material layer used in a magnetic device such as a magnetoresistive sensor, a write element, a magnetic shield, a magnetic medium or a magnetic memory cell of a magnetic random access memory (MRAM).

SUMMARY OF THE INVENTION

The present invention provides a method for manufacturing a magnetic layer with a magnetic anisotropy. The method includes an endpoint detection process for determining an end point to carefully control the final thickness of the magnetic layer. The method includes depositing a magnetic layer and then depositing a sacrificial layer over the magnetic layer. A low power angled ion milling is then performed until the sacrificial layer is detected indicating that the magnetic layer is about to be reached.

The angled ion milling can be performed at an angle relative to normal and without rotation in order to form an anisotropic surface texture that induces a magnetic anisotropy in the magnetic layer. An indicator layer may be included between the magnetic layer and the sacrificial layer in order to further improve endpoint detection.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

FIGS. 5A through 5D are cross sectional views illustrating a method of setting a magnetic anisotropy in a magnetic layer according to the present invention.

FIG. 31 is a side, cross sectional view of a magnetic memory cell of a Magnetic Random Access Memory (MRAM) array.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
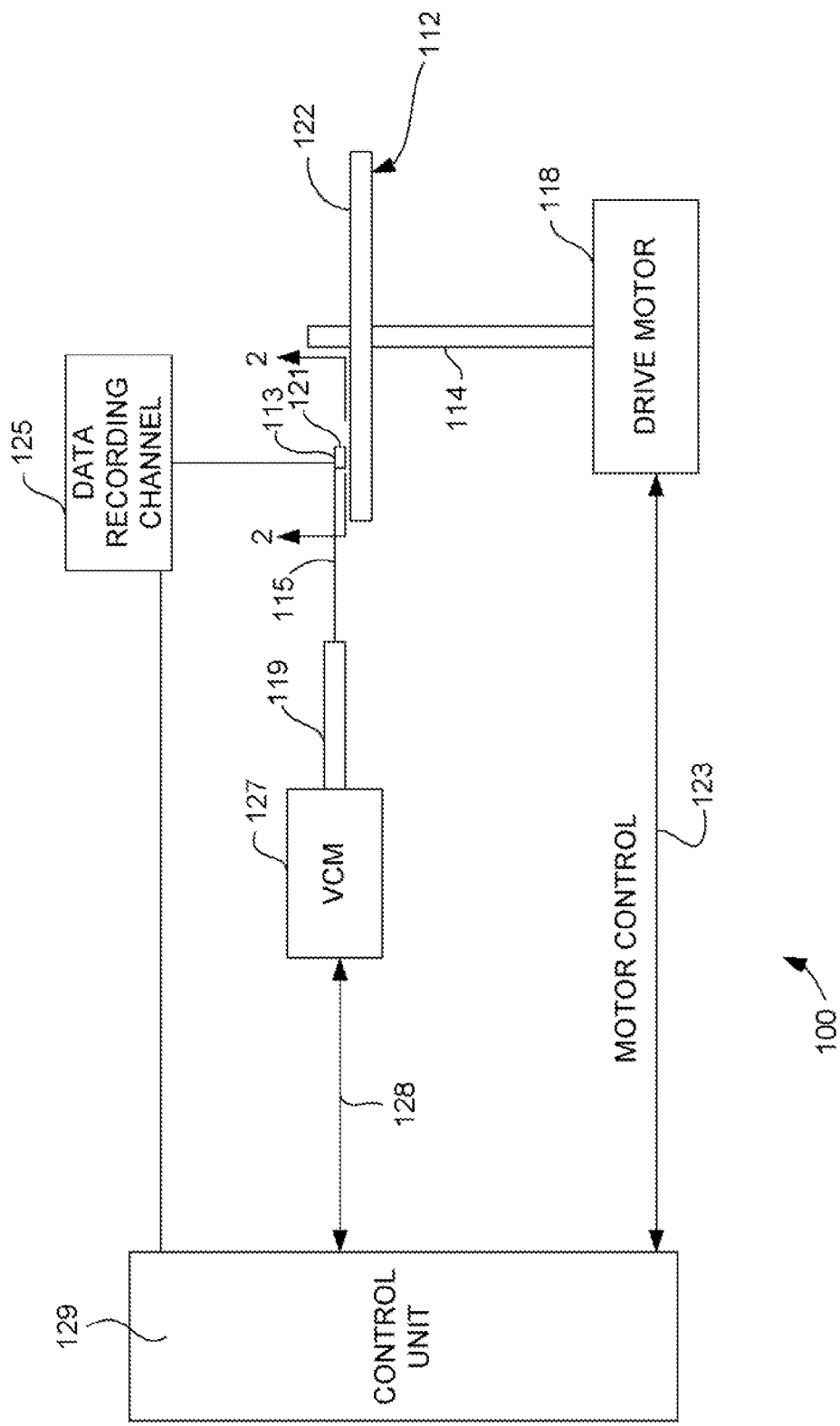
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
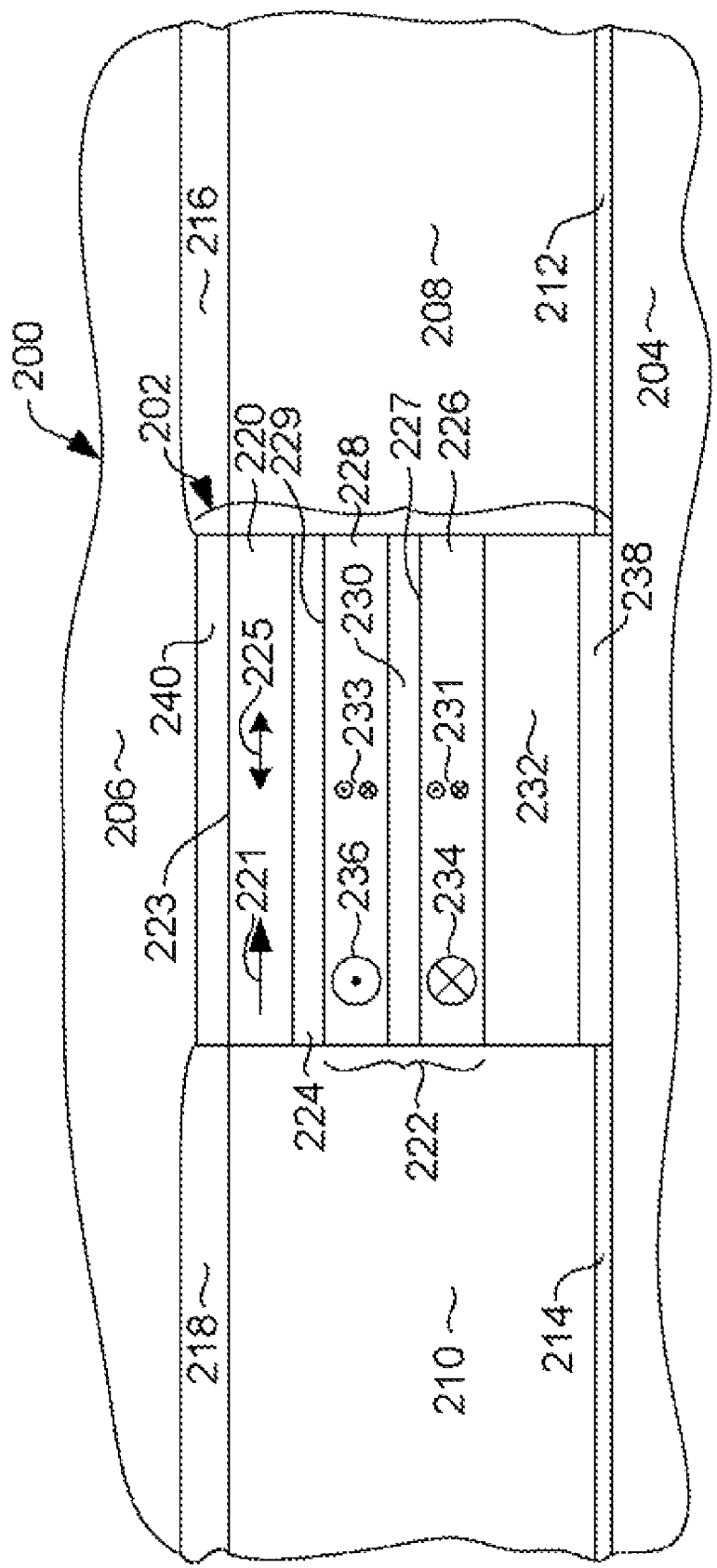
FIG. 2 is an ABS view of a sensor according to an embodiment of the invention.

Magnetoresistive Sensor Having Magnetic Layers with Tailored Anisotropy Induced by Direct Ion Milling:

With reference now to FIG. 2, a magnetoresistive sensor 200 according to the present invention is described. The sensor 200 includes a sensor stack 202 sandwiched between first and second non-magnetic, electrically insulating gap layers 204, 206. The first and second hard bias layers 208, 210 extend laterally from the sides of the sensor stack 202. The hard bias layers may be deposited over seed layers 212, 214. First and second leads 216, 218 are deposited over the hard bias layers 208, 210, and may be constructed of for example Au, Rh or some other electrically conductive material.

With continued reference to FIG. 2, the sensor stack 202 includes a magnetic free layer 220, a magnetic pinned layer structure 222 and a spacer layer 224 sandwiched between the free and pinned layers 220, 222. The free layer 220 has a magnetic moment 221 that is biased in a direction substantially parallel with the ABS, but that is free to rotate in response to a magnetic field. The pinned layer 222 may be of various configurations, such as simple, AP coupled, AFM pinned or self pinned. The free layer 220 can be constructed of one or more layers of for example NiFe, Co, CoFe or other sufficiently soft magnetic material, preferably with a layer of Co or CoFe adjacent to the spacer layer 224. The spacer layer 224 can be constructed of a non-magnetic, electrically conductive material such as Cu.

The printed layer 222 is preferably an AP coupled pinned layer having first and second magnetic layers AP1 226 and AP2 228 which are antiparallel coupled across an AP coupling layer 230. The AP1 and AP2 layers can be for example CoFe or some other suitable magnetic material. The coupling layer 230 can be constructed of, for example, Ru or Ir and is constructed of a thickness chosen to strongly antiparallel couple the magnetic moments 234 and 236 of the AP1 and AP2 layers, respectively. The coupling layer can be for example 2-10 Angstroms thick or about 8 Angstroms thick. The AP1 layer 226 may be exchange coupled with a layer of antiferromagnetic material (AFM layer 232) which strongly pins the magnetic moment 234 of the AP1 layer 226 in a desired direction substantially perpendicular to the ABS and due to AP coupling of the AP1 and AP2 layers 226 and 228 pins the moment 236 of the AP2 layer 228 in a desired direction substantially perpendicular to the ABS, but antiparallel with the moment 234 of the AP1 layer 226.

A seed layer 238 may be provided at the bottom of the sensor stack 202 to promote a desired grain structure on the subsequently deposited sensor layers. In addition, a capping layer 240, such as Ta, may be provided to protect the layers of the sensor stack 202 from damage during manufacture.

With reference still to FIG. 2, the hard magnetic bias layers 208, 210 may be constructed of a magnetic material having a high coercivity of 1.5 kOe or higher, preferably $Co_{1-x}Pt_x$ or $Co_{1-x-y}Pt_xCr_y$ (x being between 10 and 35 atomic % and y between 0 and 15 atomic %). The seed layers 212, 214 may be constructed of for example, Cr or CrX (X=Mo, Ti, V) on which the magnetic $Co_{1-x}Pt_x$ or $Co_{1-x-y}Pt_xCr_y$ material is deposited to achieve crystalline texture and sufficiently high coercivity. The magnetic hard bias layers have magnetic moments that are set substantially parallel to the ABS in order to bias the moment 221 of the free layer in a desired direction substantially parallel with the ABS.

The free layer 220 has a surface 223 that has been treated to have an anisotropic roughness. The treatment and resulting anisotropic roughness are described below with reference to FIGS. 5A-5D. The treatment of the surface 223 (described in greater detail below) of the free layer 220 is performed at such an angle that the anisotropic roughness will be oriented in such a manner to cause the free layer to have a magnetic anisotropy 225 oriented substantially parallel with the air bearing surface (ABS) as desired. Here and in the following the magnetic anisotropy axis shall refer to the magnetic easy axis. In the present case this means that the magnetic easy axis will be oriented substantially parallel to the ABS. The magnetic anisotropy 225 of the free layer greatly assists the biasing robustness of the free layer 220, and is completely additive to the biasing provided by the hard bias layers 208, 210.

With reference still to FIG. 2, one or both of the AP1 and AP2 layers 226, 228 can have surfaces 227, 229 that are treated with an anisotropic roughness that induces a magnetic anisotropy 231, 233 substantially perpendicular to the ABS as desired. This surface treatment is performed at such an angle that the anisotropic roughness will be oriented in such a manner to cause the magnetic anisotropy 231, 333 to be oriented in a direction substantially perpendicular to the ABS as desired.

It should be pointed out that either or both of the free and pinned layers 220, 222 can be treated as described to have anistropic roughness. If both the free layer and pinned layers 220, 222 are treated as described, the present invention advantageously allows the anisotropies of the free layer 225 and pinned layer 231, 233 to be set in different direction as necessary.

It should also be pointed out that the strength of the magnetic anisotropy 225, 231, 233 after removing a given amount of material is inversely proportional to the remaining thickness of the layer being treated. Therefore, if a stronger magnetic anisotropy is needed, multiple treated layers may be deposited. For example, if the free layer 220 is too thick to have a sufficiently strong anisotropy 225, a first layer may be deposited, then treated as described, then a second layer can be deposited and treated. The number of layers can be increased (and their individual thickness decreased) as needed to achieve a sufficiently strong anisotropy.

Figure 3:
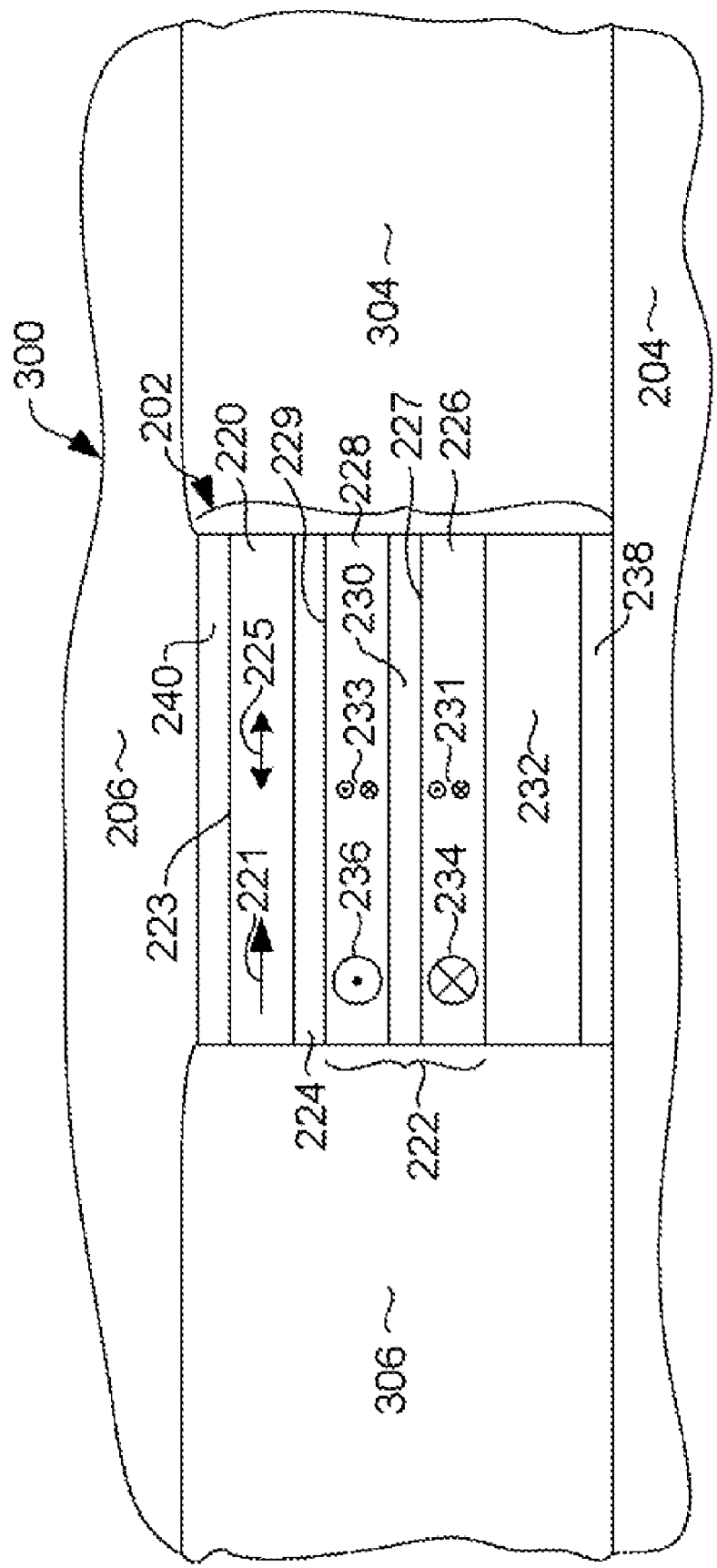
FIG. 3 is an ABS view of a sensor according to another embodiment of the invention.

With reference now to FIG. 3, a sensor 300 according to another embodiment of the invention includes a sensor stack 202, sandwiched between first and second gap layers 204, 206. As with the previously described embodiment, the sensor 300 includes a free layer 220, a pinned layer 222 and a non-magnetic spacer layer 230. Also, as with the previously described embodiments, the free layer 220 has a surface 223 that is configured with an anisotropic surface texture that induces a strong magnetic anisotropy 225 in the free layer in a direction substantially parallel with the ABS. One or more of the magnetic layers 226 228 of the printed layer may also have a surface configured with an anisotropic texture 227, 229 that induces a strong magnetic anisotropy 231, 233 in a direction substantially perpendicular to the ABS. The magnetic moment of the free layer 220 is maintained in a biased state parallel with the ABS by the strong magnetic anisotropy 225 provided by the surface texture 223. Because the free layer is biased by its magnetic anisotropy, 225, the bias layers 208, 210 provided in the previously described embodiment (FIG. 2) are not needed in the embodiment described here in FIG. 3. Therefore, the areas outside of the sensor stack 202, between the first and second gap layers 204, 206 may be filled with a non-magnetic, electrically conductive lead material 304, 306, such as Au, Rh, Cu or some other suitable material. Alternatively, the areas outside of the sensor stack 202 (ie. extending laterally beyond the sides of the sensor stack 202) may include a combination of fill material such as alumina and an electrically conductive lead material.

Figure 4:
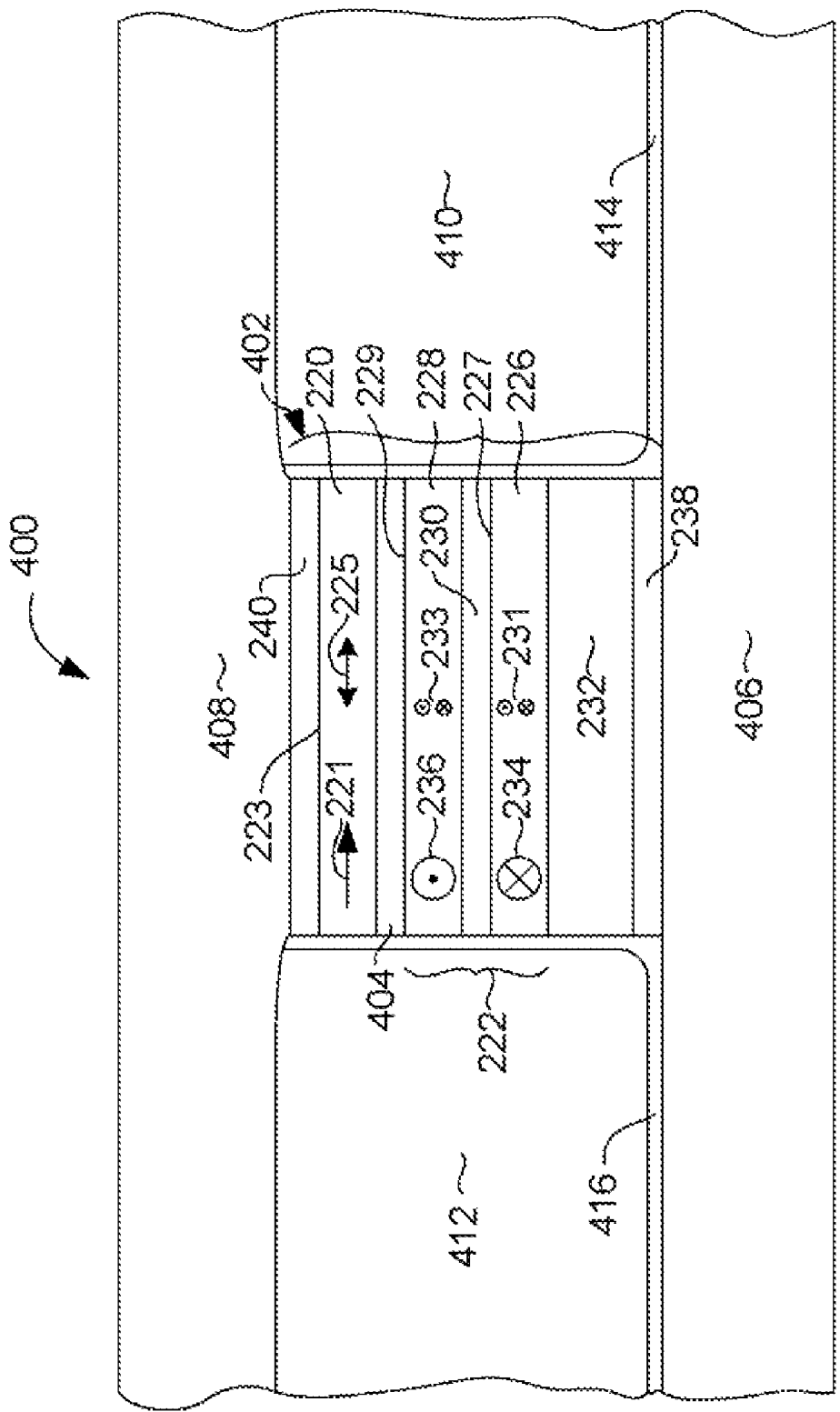
FIG. 4 is an ABS view of a sensor according to another embodiment of the invention.
Figure 5A:
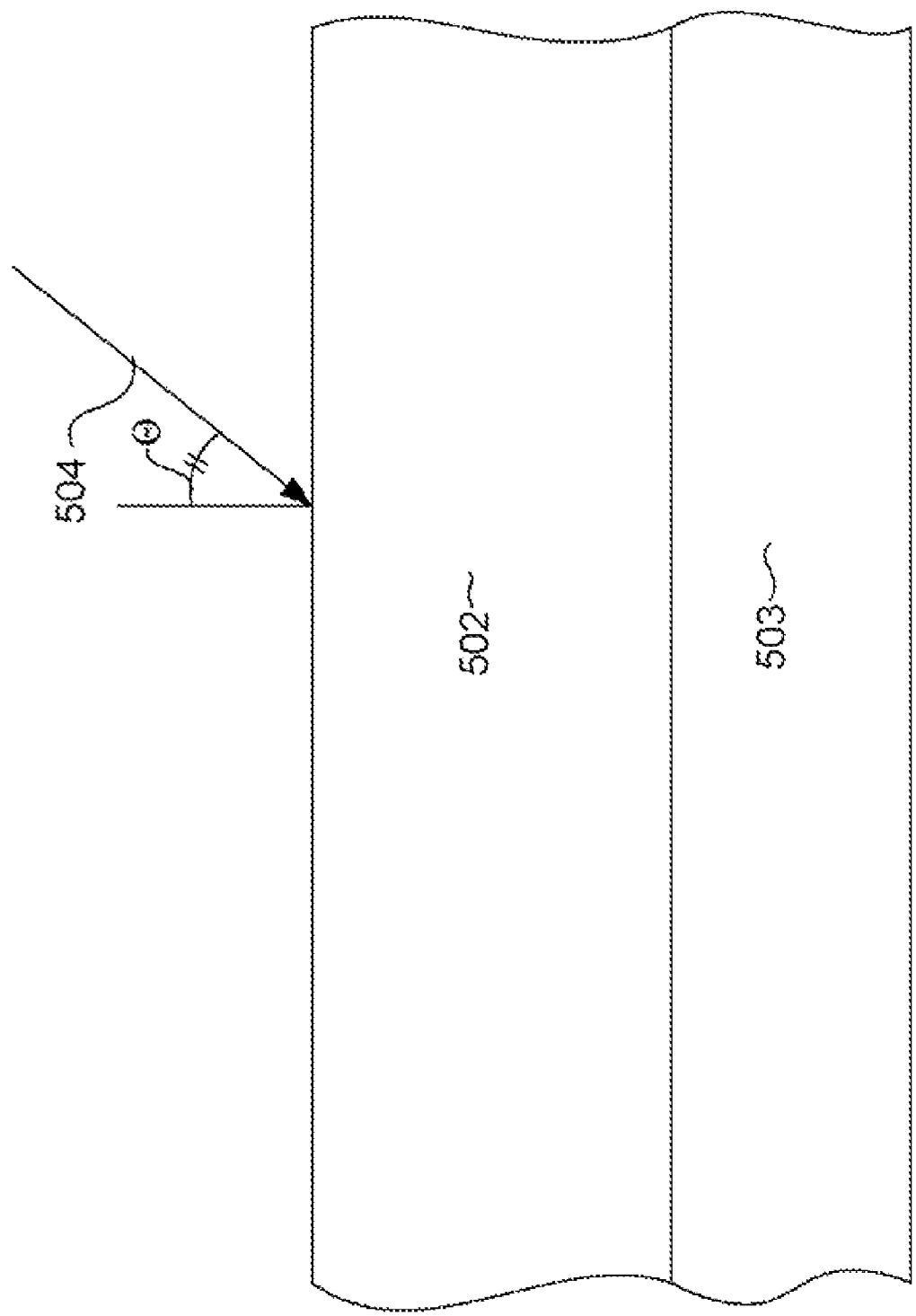
Figure 5B:
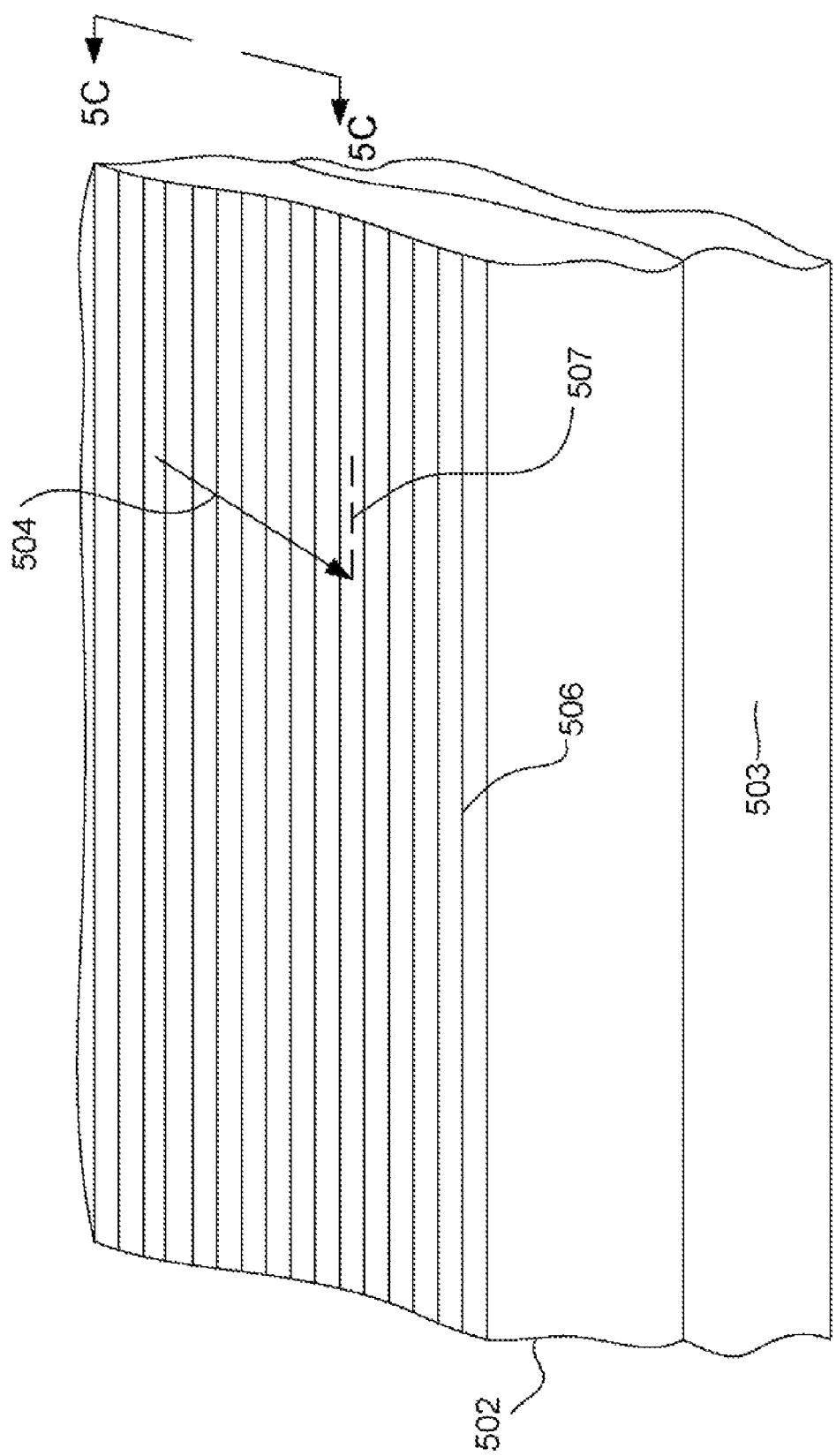
Figure 5D:
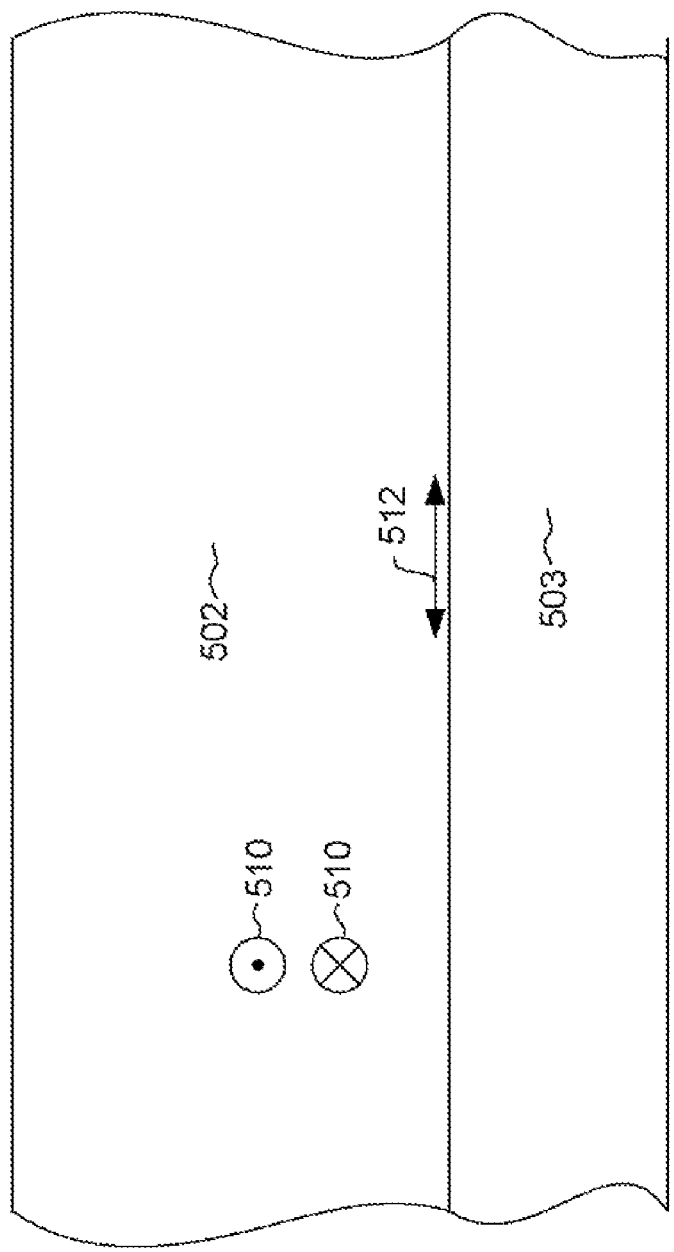

With reference to FIG. 4, another embodiment of the invention includes a current perpendicular to plane (CPP) sensor 400 that includes a sensor stack 402 having a free layer 220, a pinned layer structure 222, and a non-magnetic layer 404 sandwiched between the free layer 220 and the pinned layer structure 222. The sensor 400 can be a tunnel valve or a current perpendicular to plane giant magnetoresitive sensor (CPP GMR). If the sensor 400 is a tunnel valve, the non-magnetic layer 404 is a thin, non-magnetic, electrically insulating barrier layer 404, such as alumina ($Al_2O_3$) or MgO. If the sensor 400 is a CIP GMR, sensor, then the non-magnetic layer 404 is an electrically conductive spacer layer, such as Cu.

The sensor stack 402 is sandwiched between first and second electrically conductive leads 406, 408, which may be constructed of a magnetic material such as NiFe so that they may function as magnetic shields as well as leads. The free layer 220 has a surface 223 configured with an anisotropic texture that induces a magnetic anisotropy 225 substantially parallel with the free layer. First and second hard magnetic bias layers 410, 412 may be provided at either side of the sensor stack 402 to bias the moment 221 of the free layer 220. The bias layers 410, 412, may be constructed of a material such as CoPt or CoPtCr, and are insulated from the sensor stack 402 and at least one of the shields/leads 406 by insulation layers 414, 416, which may be constructed of, for example, alumina and which may be conformally deposited by a technique such as chemical vapor deposition (CVD) or atomic layer deposition (ALD). The insulation layers 414, 416 prevent current from being shunted through the hard bias layers 410, 412. Optionally, the hard bias layers 410, 412 can be omitted, and biasing of the moment 221 of the free layer 220 can be maintained solely by the magnetic anisotropy 225 provided by the surface texture 223.

It should be pointed out that, although the pinned layers structure 222, described with reference to FIGS. 2, 3 and 4 is described as being pinned by exchange coupling with an AFM layer 232, this AFM layer 232 could be eliminated from any one of these embodiments. In that case pinning of the moments 234, 236 of the pinned layer structure 222 can be maintained by a combination of AP coupling between the AP1 and AP2 layers 226, 228, positive magnetostriction of the AP1 and AP2 layers 226, 228, and the magnetic anisotropy 231, 233 provided by anisotropic texture of the surfaces 227, 229.

The free layer 220 described with reference to FIGS. 2, 3 and 4 can be constructed of, for example, Co, CoFe, NiFe or a combination of these materials. The AP1 and AP2 layers 226, 228 of the pinned layer structure 222 described with reference to FIGS. 2, 3, and 4 can be constructed of, for example CoFe or some other suitable material. It should be pointed out that the use of surface treated magnetic layers in a magnetoresistive device applies to any magnetic layer of any type of magnetoresistive sensor, memory cell, or magnetic device of any structure, including current in plane (CIP), current perpendicular to plane tunnel valves (CPP TMR), current perpendicular to plane giant magnetoresistive sensor (CPP GMR), dual sensors, spin-accumulation sensors, magnetic transistors, MRAM, etc.

As described above, in a free layer the surface texture induced magnetic anisotropy can be used in place of hard bias layers or can be used in conjunction with such hard bias layers. In addition, the surface texture enhanced magnetic anisotropy can be used in conjunction with and additive to any other biasing structure, such as in-stack bias or direct orthogonal exchange biasing.

In addition, the anisotropic texture induced magnetic anisotropy in a free layer can be practiced in a sensor having an AP coupled free layer, also known as a synthetic free layer. Such a structure includes two or more magnetic layers separated by and antiparallel-coupled across a non-magnetic coupling layer, which can be, for example Ru. The magnetic layers can each be treated as described, or alternatively, less than all, for example, one of the magnetic layers can be treated as described.

Anisotropic Texturing of a Magnetic Layer for Inducing a Magnetic Anisotropy in the Magnetic Layer:

With reference to FIGS. 5A through 5D, a magnetic material 502 is deposited over a substrate 503. The magnetic layer can be for example a free layer 220 (FIG. 2, 3 or 4) an AP1 or AP2 layer 226, 228 (FIG. 2, 3 or 4) or some other magnetic layer in a magnetoresistive sensor, a magnetic write head, a magnetic medium a magnetic electrode of a magnetic random access memory (MRAM) cell, or some other devices. The magnetic material 502 can be for example 30 to 300 Angstroms or about 100 Angstroms thick after ion beam milling. An ion milling (or etch) is then performed by directing an ion beam 504 at an angle $\Theta$ with respect to a normal to the surface of the magnetic layer 502. The angled ion milling (or etch) induces an anisotropic roughness or texture for example in the form of oriented ripples or facets 506 that run in a direction substantially parallel or substantially perpendicular to the in-plane projection 507 of the ion beam 504 onto the surface of the layer 502. The typical or average pitch P of the ripples 506 may be between 10-200 nm, and their average depth D may be between 0.5 to 5 nm or about 1 nm.

A magnetic easy axis 510 of the magnetic layer 502 will be generated by the anisotropic texture. Depending on the material composition and other factors such as the ion beam energy and substrate temperature, the magnetic easy axis may be either perpendicular or parallel to the direction 512 of the ripples and substantially perpendicular or parallel to the in-plane projection 506 (FIG. 5B) of the angled ion milling onto the surface of the under layer 502. Therefore, the ion milling direction must be chosen such that the resulting magnetic easy axis of the magnetic layers is in the proper, desired direction (such as substantially parallel with the ABS for a free layer or in-stack bias layer or substantially perpendicular to the ABS for a pinned layer).

The angled ion beam 504 is preferably oriented at an angle of between 20 and 80 degrees and is more preferably oriented at an angle of between 35 and 65 degrees with respect to the normal to the surface of the underlayer 502. The exact voltage, current, and angle conditions depend on the type and characteristics of the ion source in use. Typically a low energy ion beam energy such as 80 to 120 eV or about 100 eV is employed.

The initial thickness of the layer 502 and the milling time and strength are chosen to result in a final magnetic layer 502 having a desired final thickness.

End Point Detection for Direct Ion Milling to Induce Magnetic Anisotropy:

In order to optimize the effectiveness of the direct ion milling method described above, it is important to carefully control the resulting final thickness after the ion milling has been completed. The final thickness of the magnetic layer will not only affect the efficiency of the resulting magnetic anisotropy, but will also affect the performance of the magnetic layer for its intended function. For example, the thickness of a free layer is very important to the performance of the free layer. As can be appreciated, the direct ion milling removes material from the magnetic layer, and the longer the ion milling and the stronger the power, the greater the amount of the material removed.

Figure 6:
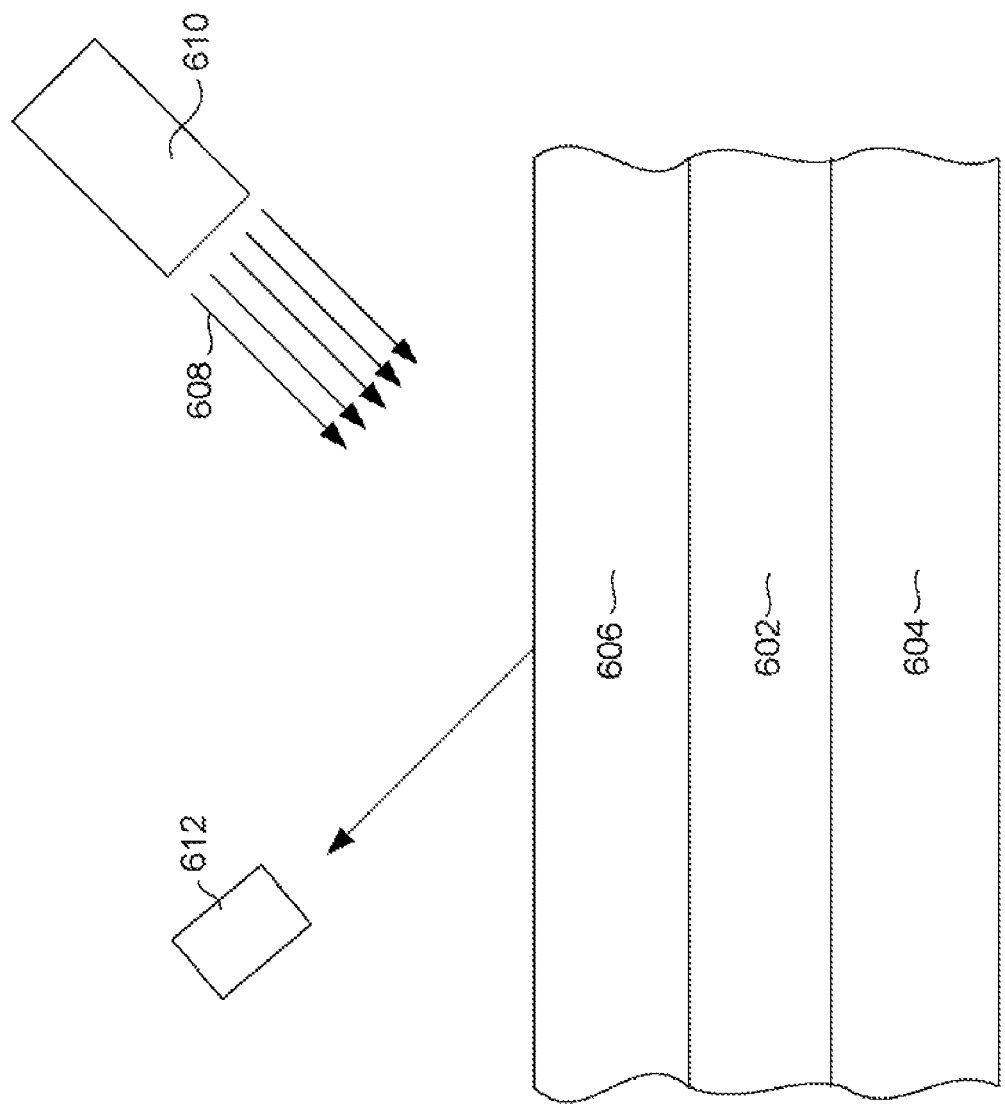
FIG. 6 is a schematic illustration describing an ion milling endpoint detection method according to an embodiment of the invention.

With reference to FIGS. 6, a novel endpoint detection method is described for determining at what point the ion milling should terminate in order to produce a magnetic layer having a desired final thickness. The magnetic film can be deposited substantially to its desired final thickness, or possibly slightly thicker. A magnetic layer 602 is deposited onto a substrate 604, which can be any form of under-layer. A sacrificial film 606 is deposited over the magnetic layer 602. This sacrificial film 606 is preferably constructed of a different material than the magnetic layer 602.

A stationary angled ion beam 608 performs an ion milling, using an ion source 610 in order to remove sufficient sacrificial layer material to create an anisotropic roughness on its surface. An etch detector 612, such as SMS (Secondary Ion Mass Spectrometer) detects material removed by the ion beam 608. As the sacrificial layer 606 is being removed by the ion beam 608, the etch detector will detect sacrificial layer particles. When the ion beam 608 has sufficiently removed the sacrificial layer 606 (ie. the magnetic layer 602 has been reached), then the etch detector 612 will begin to detect particles of material making up the magnetic layer 602. This indicates that ion milling can be terminated. The sacrificial layer 606 material is chosen experimentally to create the most favorable anisotropic roughness by ion milling. Any anisotropic roughness from the sacrificial layer 606 will be transferred into the magnetic layer 602.

Figure 7:
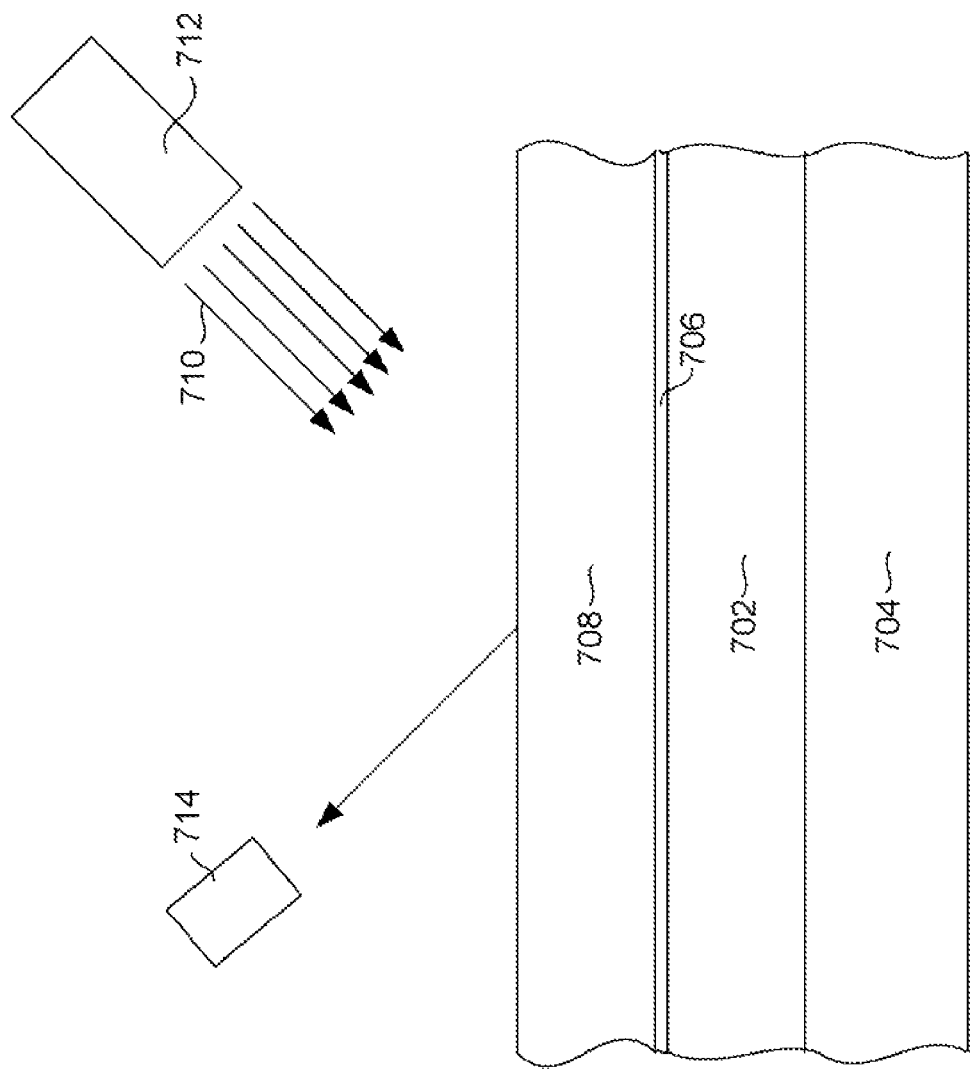
FIG. 7 is a schematic illustration describing an ion milling endpoint detection method according to another embodiment of the invention.

With reference to FIG. 7, in an alternate embodiment of the invention, a magnetic layer 702 is deposited on a substrate 704, the substrate can be any layer such as a spacer layer, a pinned layer seed layer, a Ru AP coupling layer, or any other layer that might be present under a magnetic layer that would benefit from the described surface treatment. A thin indicator layer 706 is deposited on the magnetic layer 702, and a sacrificial layer 708 may be deposited on the indicator layer. A stationary ion beam 710 is provided by an ion source 712, and an etch detector 714 is provided for detecting the material being removed by the ion beam 710 at any give time.

The role of the indicator layer 706 is to indicate when ion milling needs to be stopped. The detection of the indicator layer 706 can be achieved for example by using SIMS or another in-situ detection technique. If a sufficiently slow etching indicator material in comparison with the sacrificial or magnetic layer material is chosen, then the indicator layer 706 can also act as a milling stop to improve milling uniformity. The materials of the sacrificial layer 708 and indicator layer 706 are chosen experimentally to create the most favorable anisotropic roughness by ion milling. This anisotropic roughness is then transferred into the magnetic layer for maximum anisotropy. The sacrificial material 708 does not remain in the final sensor. The indicator material 706 may or may not remain in the final sensor as needed. The indicator layer 706 may be used to simply indicate the endpoint of the process, or may be used to indicate the point at which different milling parameters are needed to finish the process.

For example, the magnetic layer 702 may be Nk, Fe, Co or their alloys, the indicator layer 706 may be one of Ta, Ru, Pt, Cr, Pd, Ti, Al, the sacrificial layer 708 may be one of Ru, Ta, Au, Cu, Ag. The magnetic film may be a magnetic layer in a magnetic sensor or other magnetic device in which a uniaxial magnetic anisotropy can improve the performance of the device. The direction of the ion milling with respect to the substrate is chosen to create the appropriate anisotropic roughness which induces a magnetic anisotropy axis in layer 702 that is substantially parallel to the ABS is the case of a magnetic, free layer or in-stack bias layer or substantially perpendicular to the ABS in case of a magnetic pinned layer.

Figure 8:
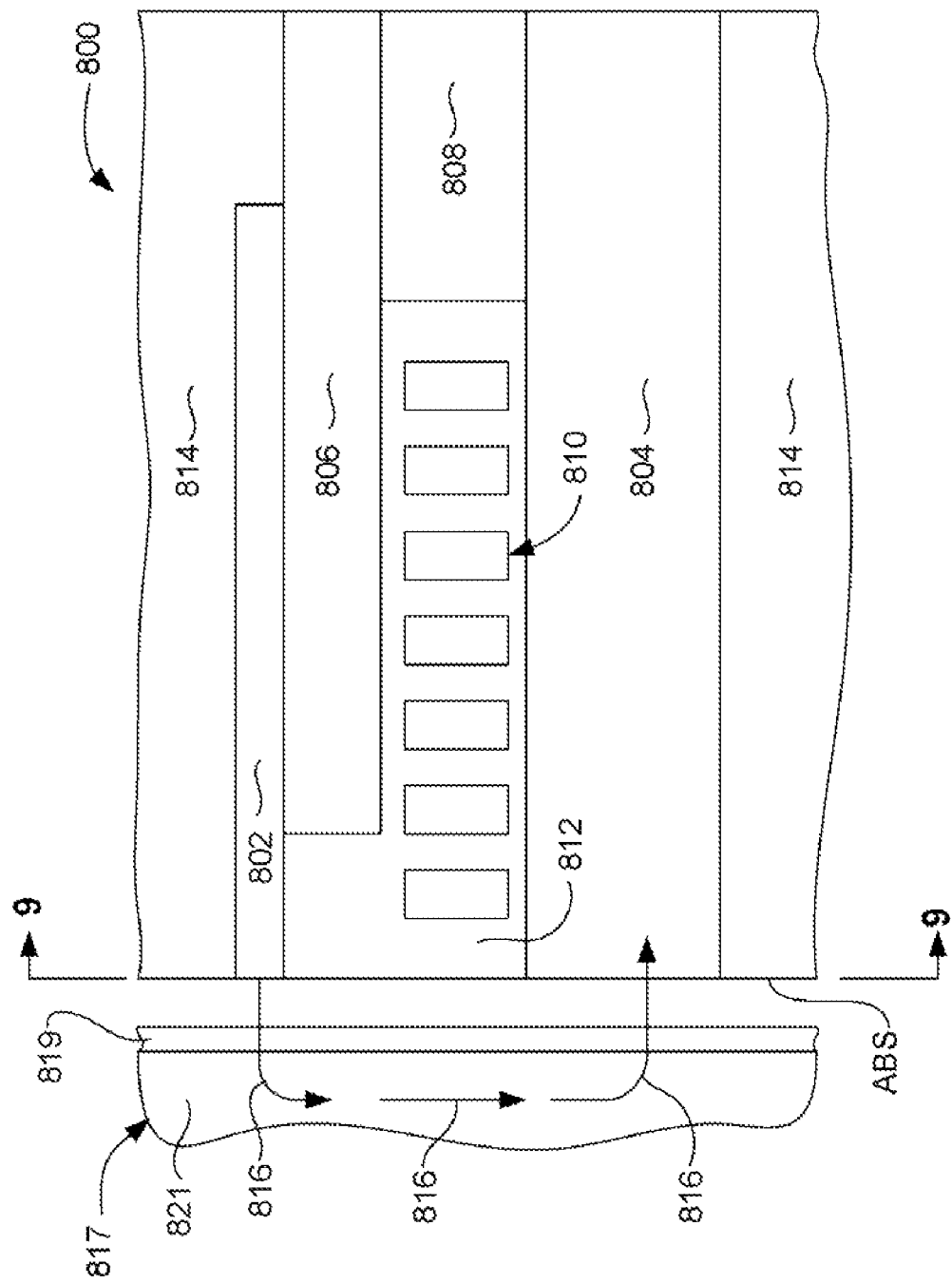
FIG. 8 is a cross sectional view of a magnetic write head according to an embodiment of the invention.

Magnetic Write Head with Magnetically Anisotropic Write Pole:

With reference now to FIG. 8, the present invention can also be embodied in a magnetic write head such as a perpendicular magnetic write head 800. The write head 800 includes a write pole 802, and a return pole 804. The write pole 802 is connected with a magnetic shaping layer 806, and the shaping layer 806 and return pole 804 are connected by a magnetic back gap layer 808. The return pole 804, back gap 808 and shaping layer 806 can be constructed of various magnetic materials, such as NiFe or some other suitable magnetic material. The write pole 802 can be constructed of various magnetic materials and is preferably constructed of a material having a low coercivity and a high moment, such as CoFe. The write pole may also be constructed as a laminate structure, with many layers of magnetic material separated from one another by thin non-magnetic layers.

An electrically conductive coil 810 passes between the return pole 804 and the shaping layer 806 and write pole 802. The electrically conductive coil can be constructed of, for example Cu and is surrounded by an insulation layer 812, which can be one or more layers of, for example, alumina. The write head 802 may be sandwiched between electrically insulating, non-magnetic layers 814. The write head 800 has a surface for facing a magnetic medium, also referred to as an air bearing surface or ABS.

Figure 9:
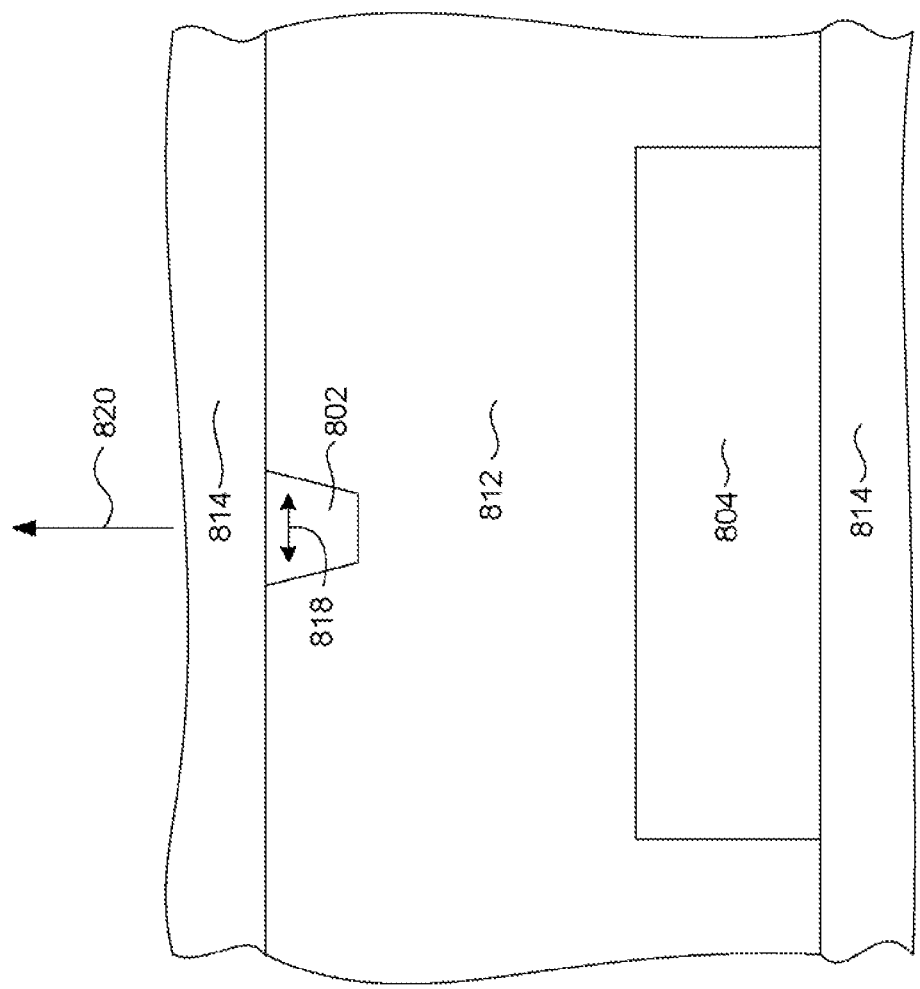
FIG. 9 is an ABS view, taken from line 9-9 of FIG. 8, of the magnetic write head of FIG. 8.

With reference still to FIG. 8, as electrical current flows through the coil 810 (FIG. 9) a magnetic field is induced that results in a magnetic flux flowing through the write pole 802, shaping layer 806, back gap 808 and return pole 804. This flux makes a complete circuit by emitting a write field 816 that extends from the write pole 802 and passes through an adjacent magnetic medium 817 and back to the return pole 804. In a typical perpendicular recording design the magnetic medium 817 has a thin high coercivity top layer 819 and a lower coercivity underlayer 821. With reference to FIG. 9, which shows the write head as viewed from the ABS, the write pole 802 has a much smaller cross section than the return pole 804. This means that the magnetic field emitting from the return pole 802 is much more concentrated than the magnetic field returning to the return pole 804, because the field at the return pole 804 is much more spread out. Therefore, the magnetic field from the write pole is sufficiently strong to magnetize the thin, high coercivity top layer, but is sufficiently weak at the return pole, that it does not erase the signal written by the write pole. It can also be seen with reference to FIG. 9 that the write pole 802 can be constructed with a trapezoidal shape. This shape is helpful in avoiding adjacent track writing when the magnetic head is skewed at an angle when the head is at extreme outer or inner radii of a magnetic disk including the magnetic medium during use.

With continued reference to FIG. 9, the write pole 802 has a laterally oriented magnetic anisotropy or magnetic easy axis 818 that is oriented perpendicular to a track direction 820 and parallel with the ABS and surface of a magnetic medium during use (magnetic medium not shown). As those skilled in the art will appreciate, during use, the magnetization of the write head oscillates between positions into and out of the ABS, or into and out of the plane of the page in FIG. 9. Having a magnetic easy axis that is parallel with the ABS (parallel with the plane of the page in FIG. 9) increases the speed at which the magnetization of the write head can oscillate to positions into and out of the ABS. Therefore, this magnetic easy axis 818 greatly increases writing speed and efficiency.

Perhaps more importantly, the magnetic easy axis 818 prevents the write pole 802 from inadvertently writing to a magnetic medium which would cause unacceptable signal noise and loss of data. As can be seen with reference to FIGS. 8 and 9, the write pole has a long narrow shape. This causes a shape induced magnetic anisotropy in an undesired direction perpendicular to the ABS. Were it not for the intentionally created magnetic anisotropy 818 parallel with the ABS, this shape induced anisotropy perpendicular to the ABS would cause the write pole 802 to be magnetized either into or out of the ABS in a quiescent state (i.e. when no current flows through coil 810). As can be appreciated then, the shape induced magnetic anisotropy can cause the write pole 802 to write a signal to a magnetic medium even when such signal is not desired. The presence of the intentionally generated magnetic anisotropy 818 prevents this inadvertent writing by maintaining the magnetization of the write pole 802 in a neutral state when current is not flowing through the coil. Methods for constructing a write pole 802 to have such a magnetic anisotropy 818 according to embodiments of the invention are described herein below.

Figure 10:
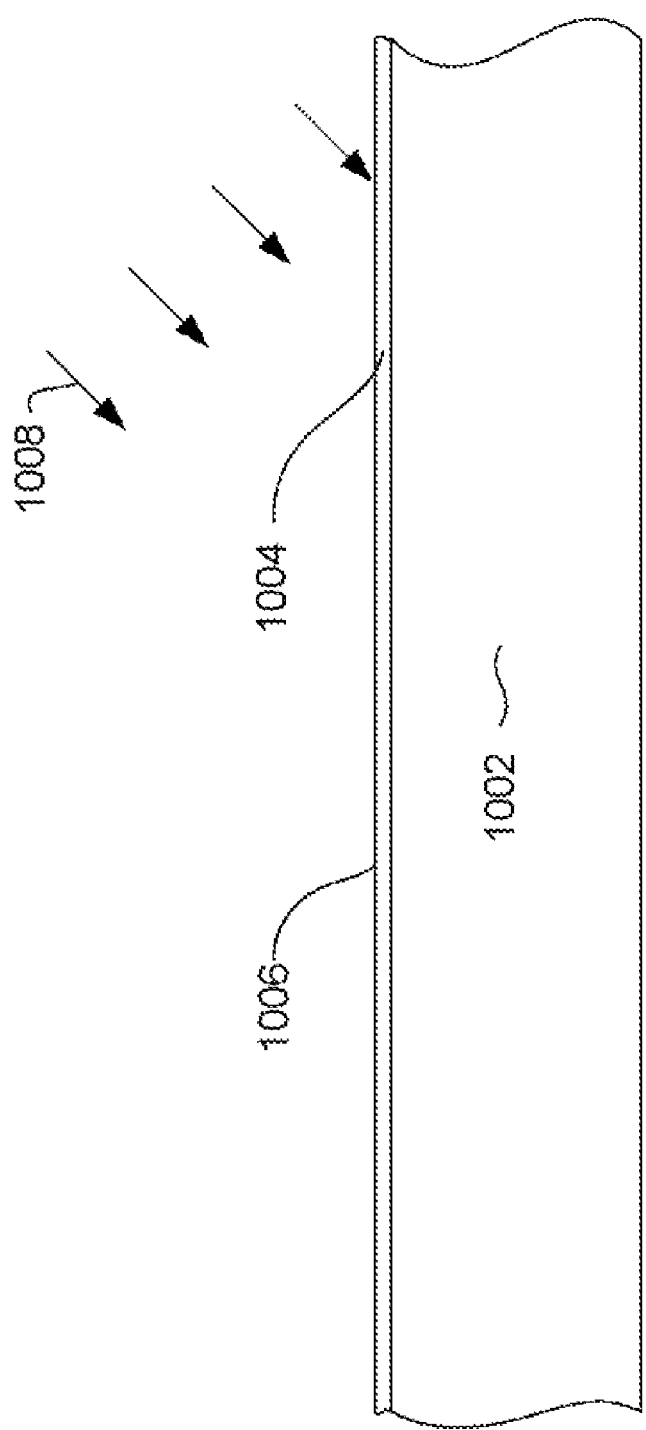
FIGS. 10-14 are views of a magnetic write head in various intermediate stages of manufacture, illustrating a method of constructing a magnetic write pole according to an embodiment of the invention.

With reference to FIGS. 10 through 14, methods for constructing a magnetic write pole having a magnetic anisotropy in a desired direction are described. With particular reference to FIG. 10, a substrate 1002 is provided, which may be, for example, the insulation layer 812 and shaping layer 806 described in FIGS. 8 and 9, both of which have been planarized to have smooth flat coplanar surfaces. An electrically conductive seed layer 1004 is deposited over the substrate 1002. The seed layer has a surface 1006 and can be constructed of a magnetic material similar to the write pole material or could be a non-magnetic electrically conductive material.

With continued reference to FIG. 10, an angled, direct ion beam 1008 performs an angled ion milling to form an anisotropic roughness in the surface 1006 of the seed layer 1004. The ion milling and resulting anisotropic roughness are described in greater detail with reference to FIGS. 5A through 5D.

Figure 11:
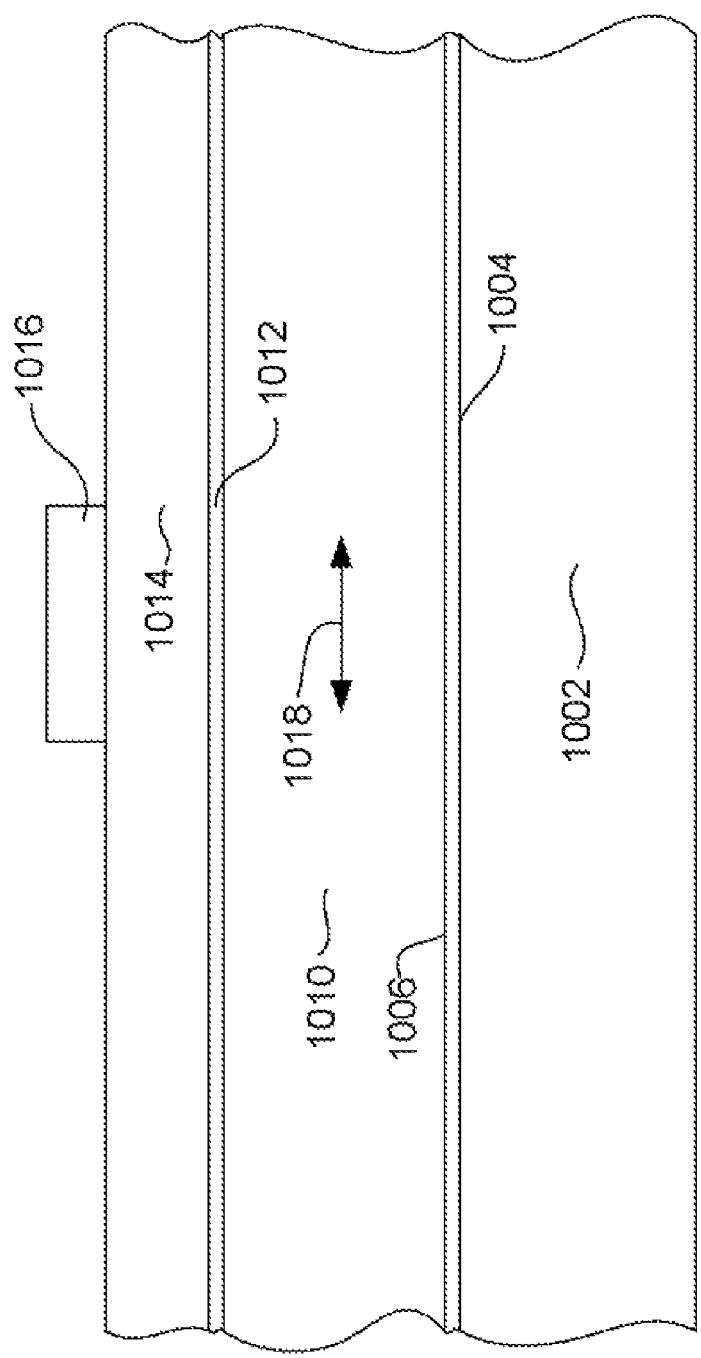

With reference to FIG. 11, a layer of magnetic material 1010 is deposited over the seed layer 1004. The magnetic material 1010 can be, for example CoFe or some other magnetic material. A thin layer of hard mask material 1012 is then deposited over the magnetic layer 1010. The hard mask layer 1012 can be, for example alumina ($Al_2O_3$), $SiO_2$, diamond like carbon (DLC), etc. An image transfer layer 1014, such as DURIMIDE® can be deposited over the hard mask 1014. A photosensitive mask layer 1016, such as photoresist is then deposited over the image transfer layer 1014 and is photolithographically patterned to have a width that is chosen to define a track width of the write pole 802 (FIGS. 8 and 9).

The anisotropic texture of the surface 1006 of the seed layer 1004 results in a magnetic easy axis 1018 in the magnetic pole material layer 1010. This magnetic anisotropy is described in greater detail in FIGS. 5A through 5D. As described above, the effect of the anisotropic roughness in generating a magnetic anisotropy that is (after removing a given amount of material) inversely proportional to the remaining thickness of the layer being treated. Therefore, if a greater magnetic anisotropy 1018 is needed, the magnetic layer 1010 can be deposited in several stages by depositing a portion of the magnetic layer 1010, performing an angled ion milling, depositing some more magnetic layer 1010, performing another angled ion milling, etc. With each ion milling preferably being a low powered ion milling as described in FIGS. 5A through 5D. The series of angled ion millings can greatly increase the amount of magnetic anisotropy in the write pole 802.

Figure 12:
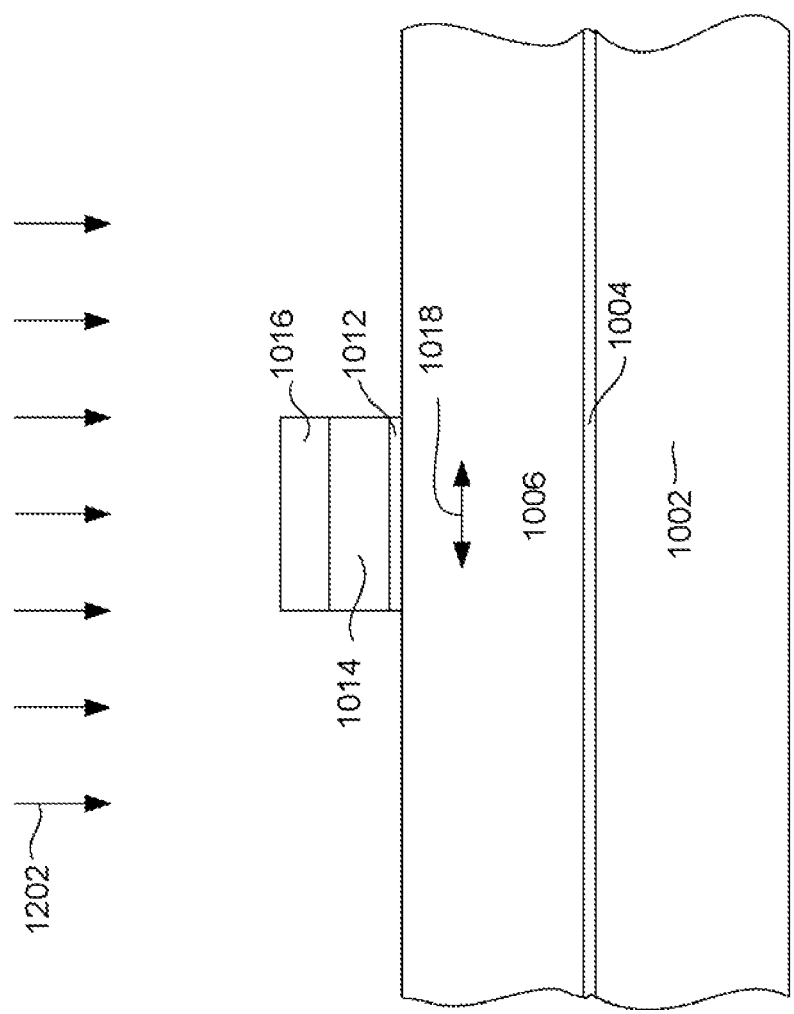
Figure 13:
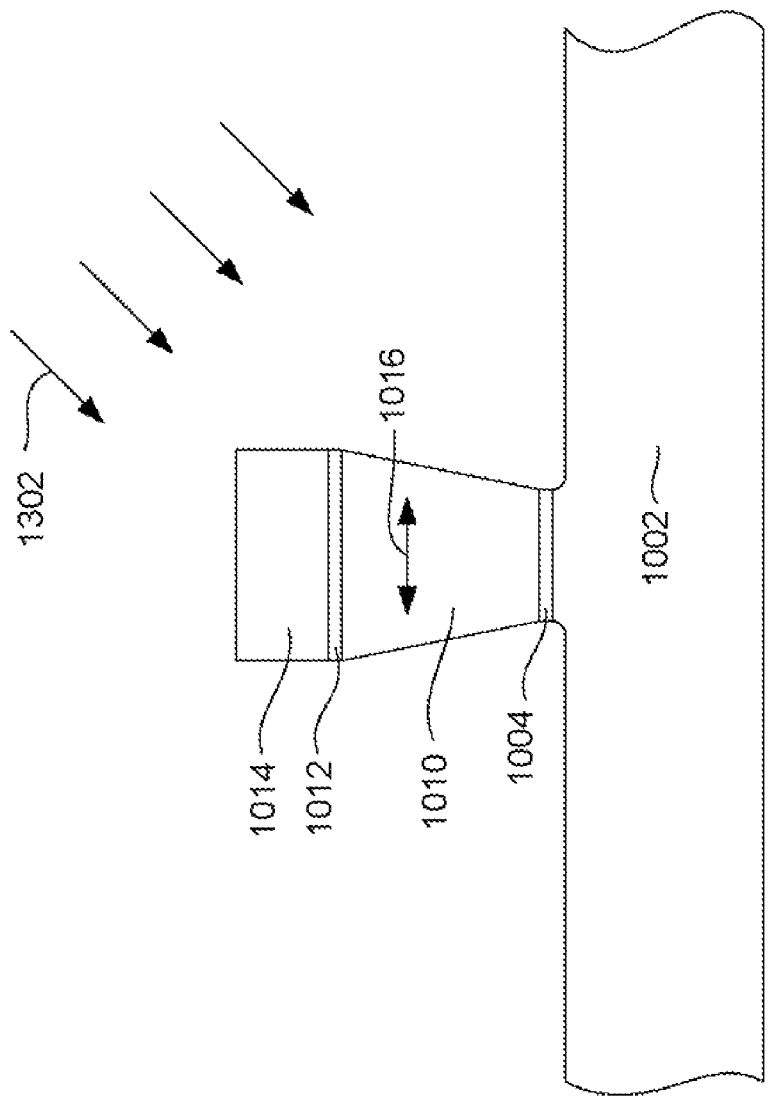

With reference now to FIG. 12, a reactive ion beam 1202 performs a reactive ion etch (RIE) to transfer the image of the photoresist mask 1016 into the underlying image transfer layer 1014 and the hard mask layer 1012 by removing material not protected by the photo mask 1016. Then, with reference to FIG. 13, an ion beam 1302 performs an ion milling to remove portions of the magnetic layer 1010 that are not protected by the hard mask 1012, thereby forming the write pole 802 described in FIGS. 8 and 9. The ion milling is preferably performed from two sides at an angle with respect to normal in order to create a write pole having the desired trapezoidal shape discussed with reference to FIG. 9. During ion milling, the ion beam 1302 removes the photoresist layer 1016 (FIG. 12) and also likely removes a portion of the image transfer layer 1014. After the write pole 802 has been formed, an insulation material can be deposited and the remaining mask layers 1012, 1014 can be removed.

Figure 14:
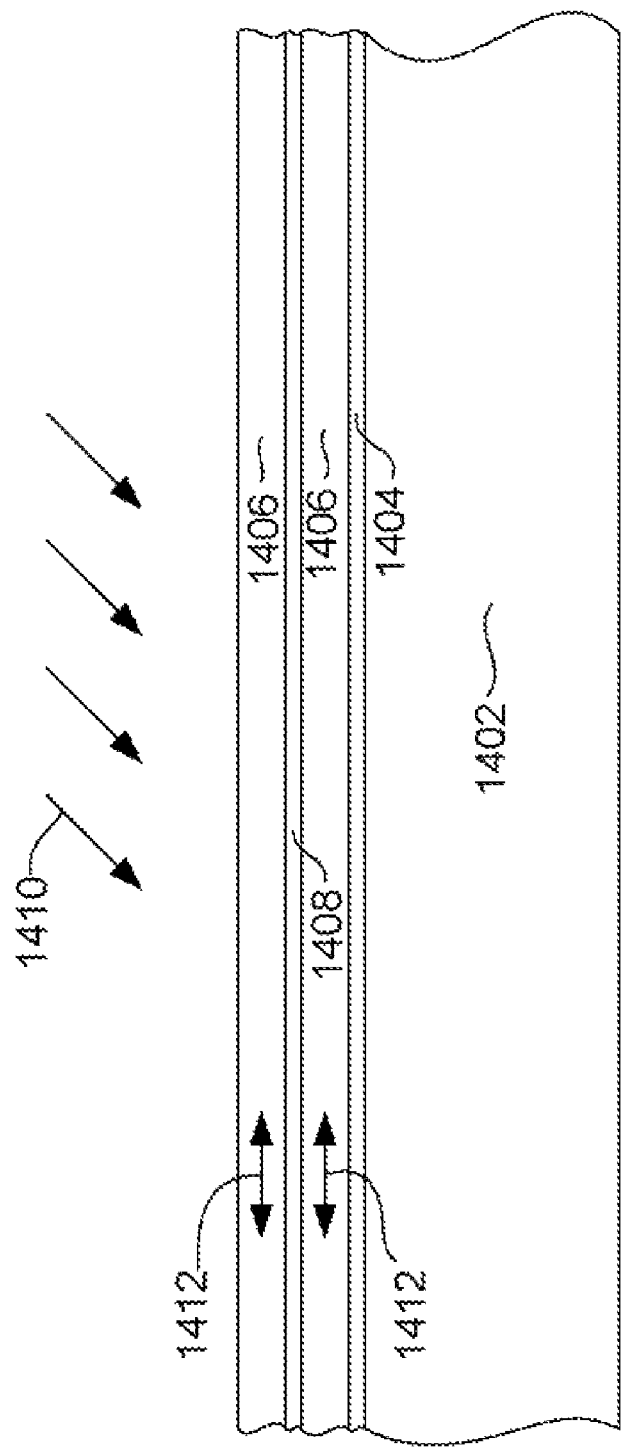

With reference now to FIG. 14, in another similar embodiment of the invention, a muli-layer, laminated write pole can be formed. A substrate 1402 is provided and an electrically conductive seed layer 1404 is deposited over the substrate 1402. Then a series of alternating magnetic layers 1406, and thin, non-magnetic layers 1408 are deposited. The magnetic layers can be constructed of, for example, CoFe and the thin, non-magnetic layers can be constructed of, for example Cr, NiCr, Rh, Ru, Ta, or alumina ($Al_2O_3$). The magnetic layers 1406 can each have a thickness of, for example 100-500 Å, and the non-magnetic layers 1408 can each have a thickness of, for example 5-30 Å. Constructing the magnetic write pole material as a laminated structure of magnetic layers 1406 separated by thin non-magnetic layers 1408 prevents the formation of magnetic domains and significantly improves magnetic performance.

After depositing a magnetic layer 1406, the surface of the magnetic layer 1406 is treated with a low-power angled ion beam 1410 in an angled ion milling to create a desired anisotropic surface texture as described in FIGS. 5A through 5D. The surface texture generated by the ion milling is constructed so as to induce a magnetic anisotropy 1412 in a desired direction substantially perpendicular to the down track direction and substantially parallel with the ABS.

It should be pointed out that the final deposited alternating layers of magnetic material 1406 and non-magnetic material 1408 will include many such layers. It should also be pointed out that the surfaces of any number of the magnetic layers 1406 can be treated. For example, only one or a few of the magnetic layers can be treated by the ion beam 1410 during ion milling, or all of the magnetic layers 1406 can be treated depending upon the strength of the magnetic anisotropy needed. Alternatively, or in addition to treating the surfaces of the magnetic layers 1406, the surfaces of the non-magnetic layers 1408 can be treated with the ion beam 1410 during ion milling to produce an anisotropic surface texture on the nonmagnetic layers 1408. The treated non-magnetic layers, then, become underlayers for the subsequently deposited magnetic layers, and this treatment of the underlying non-magnetic layers 1408 induces a desired magnetic anisotropy in the magnetic layers 1406 deposited thereon.

Figure 15:
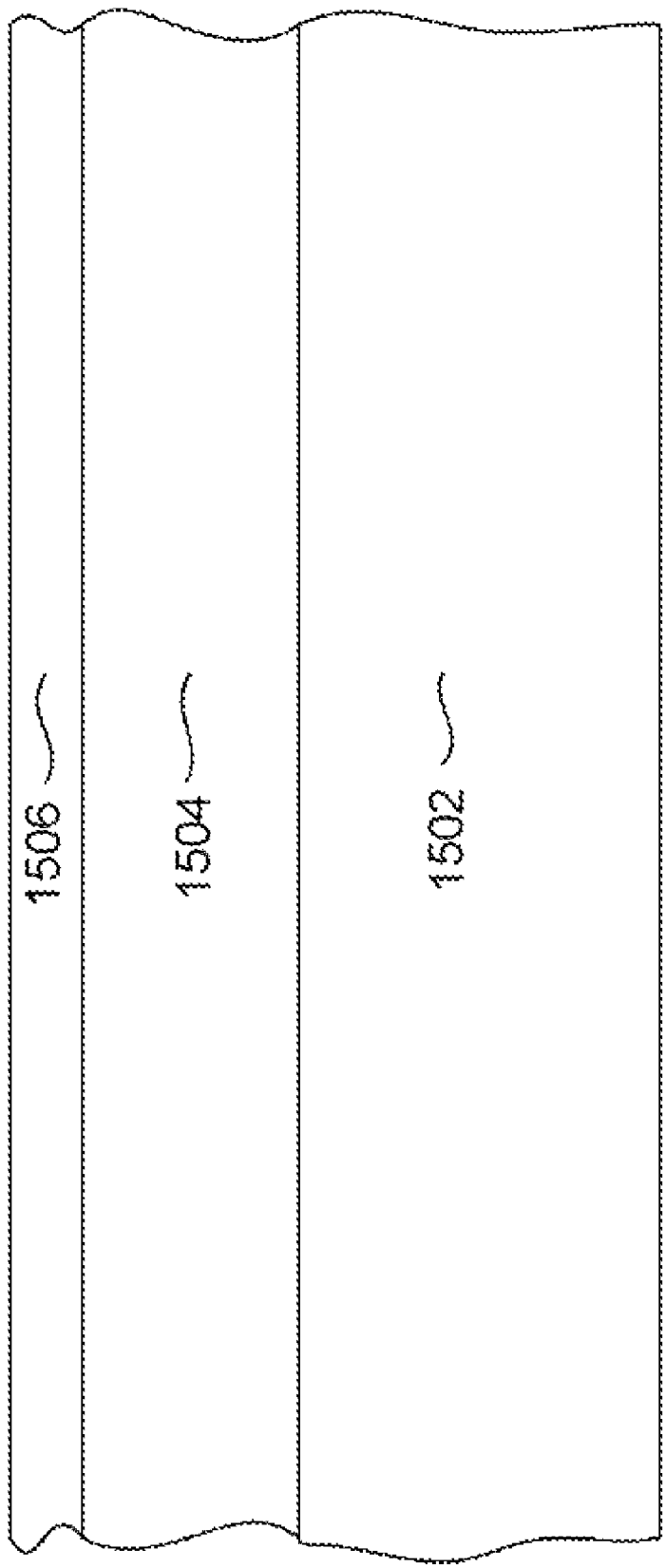
FIG. 15 is a partial, cross sectional view of a magnetic medium (disk) according to an embodiment of the invention.

Magnetic Medium having a Soft Underlayer with a Magnetic Anisotropy:

With reference not to FIG. 15, a magnetic medium for use in perpendicular magnetic recording includes a substrate 1502, a magnetic soft underlayer 1504 formed on the substrate and a thin magnetically hard top layer 1506 formed on the underlayer 1504. The substrate may be constructed of a material such as glass or AlTiC. The magnetically soft underlayer 1504 can be constructed of a relatively low coercivity material such as $NiFe_{14}$ or $CoNb_8Zr_5$. The higher coercivity top layer 1506 can be constucted of, for example, CoCrPrB. It may be a single layer or a multilayer such as antiferromagnetically coupled media.

Figure 16:
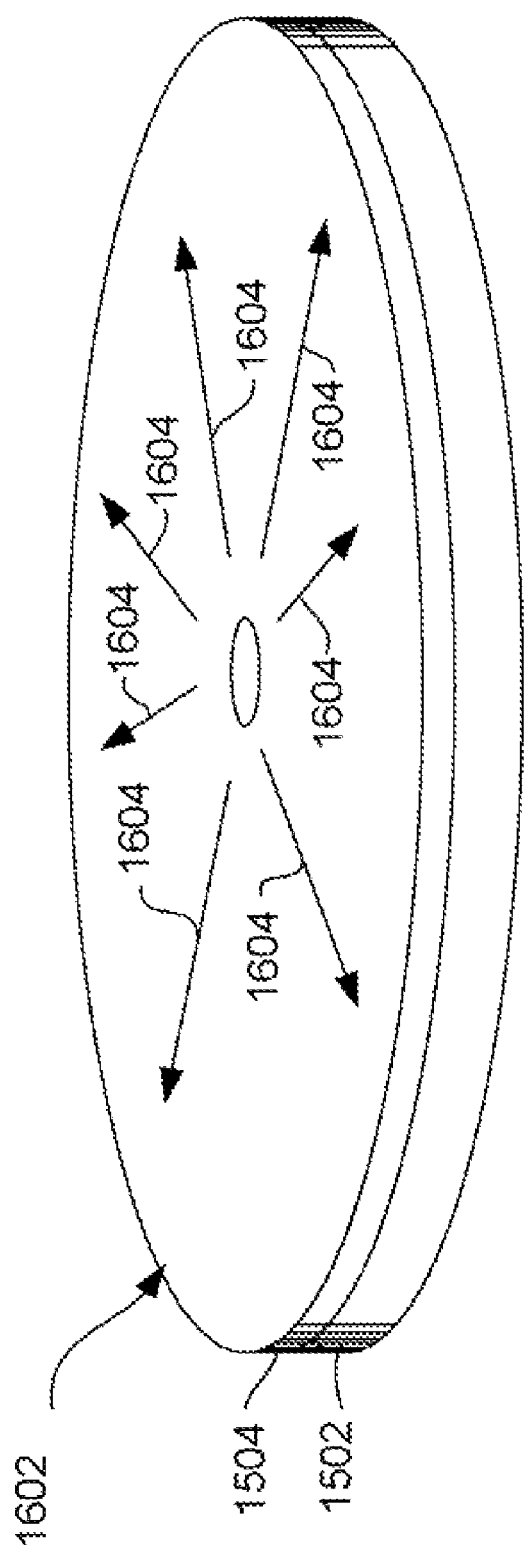
FIG. 16 is a perspective view of a magnetic medium (disk) according to an embodiment of the invention.

With reference now to FIG. 16, a magnetic disk 1602 of the magnetic medium is shown with the high coercivity top layer removed for clarity to show the soft underlayerlayer 1504 deposited over the substrate 1502. The disk 1602 has a magnetic anisotropy 1604 in the soft underlayer 1504 (FIG. 15) that is oriented in a radial direction over substantially the entire area of the disk 1602. Such a radially oriented magnetic anisotropy 1604 prevents uncontrolled domain structures from forming in the soft underlayer 1504, which would otherwise cause unwanted noise and performance issues. The magnetic anisotropy 1604 tends to keep the underlayer 1504 magnetized in a direction substantially perpendicular to the track direction when the disk is not being written to. Furthermore, this magnetic anisotropy is achieved without increasing the magnetic coercivity of the underlayer so that it is still permeable as desired.

Figure 17:
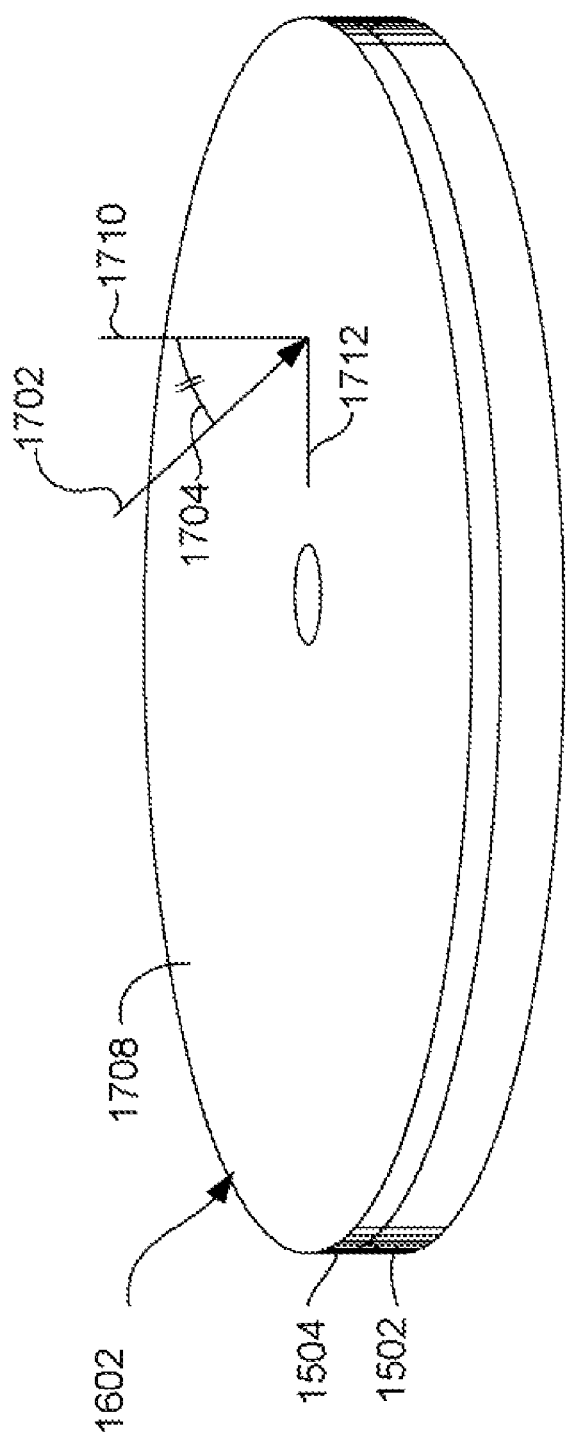
FIGS. 17-20 are perspective views illustrating a method of constructing a magnetic medium (disk) according to embodiments of the invention.

With reference to FIG. 17, a method for making a magnetic disk 1602 (magnetic medium) with a radially oriented magnetic anisotropy is described. In one possible method of constructing such a magnetic medium, a substrate 1502 is provided and a magnetically soft underlayer 1504 is deposited onto the substrate 1502. After deposition of the soft underlayer 1504, a stationary low powered angled ion beam 1702 performs an angled ion milling to etch the surface 1708 of the soft underlayer at an angle 1704 of, for example 45 degrees, with respect to normal 1710 of the surface 1708 of the underlayer 1504. This ion milling and the resulting texture can be better understood with reference to FIGS. 5A-%D. The initial thickness of the soft underlayer 1504 is chosen to create a desired final thickness of the soft underlayer 1504 after ion milling with an appropriate anisotropy. For a given final target thickness, larger anisotropy is obtained with larger initial thickness and longer milling time.

With continued reference to FIG. 17, in order to form a surface texture that will induce a radially oriented magnetic anisotropy the ion beam 1702 must be angled such that its projection onto the plane of the surface of the soft underlayer 1504 is either oriented radially or tangentially (circumferentially) while spinning the disk. Depending on the material composition of the soft underlayer 1504 and other factors such as the ion beam energy or the substrate temperature, the magnetic anisotropy may be either perpendicular to the ion milling orientation or parallel to the ion milling orientation. For example, with reference to FIG. 17, the projection 1712 of the ion beam 1702 onto the plane of the surface 1708 is oriented radially with respect to the disk 1602.

Figure 18:
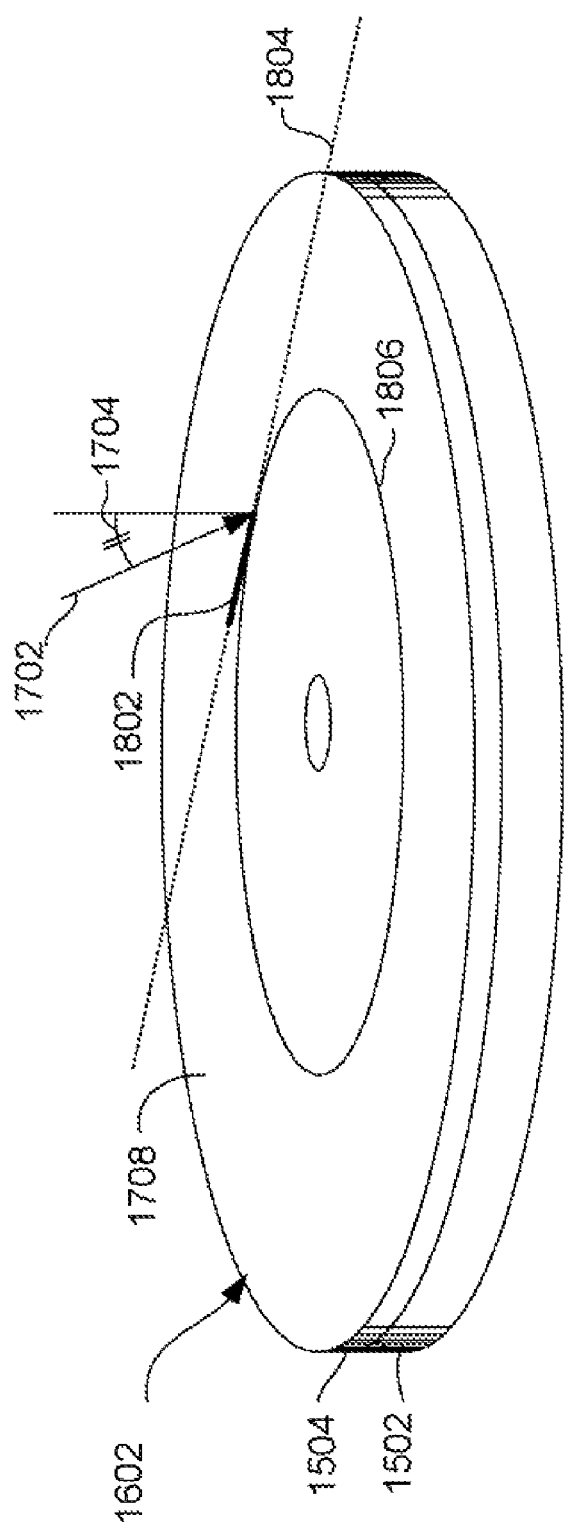

With reference to FIG. 18, the ion beam 1702 performs an angled ion milling such that the projection 1802 of the ion beam 1702 onto the surface 1708 is oriented along a tangent 1804 of a circle 1806 that is concentric with the disk. In other words, the ion milling is performed in a circumferential manner. As mentioned above, the choice of whether to perform the ion milling in a radial direction (as in FIG. 17) or in a circumferential direction (as in FIG. 18) depends on the material used for the underlayer 1504, and may depend upon other parameters as well. The goal, however, is to produce an anisotropic texture on the surface 1708 that will produce a radially oriented magnetic anisotropy 1604 (FIG. 16) in the soft underlayer 1504.

Figure 19:
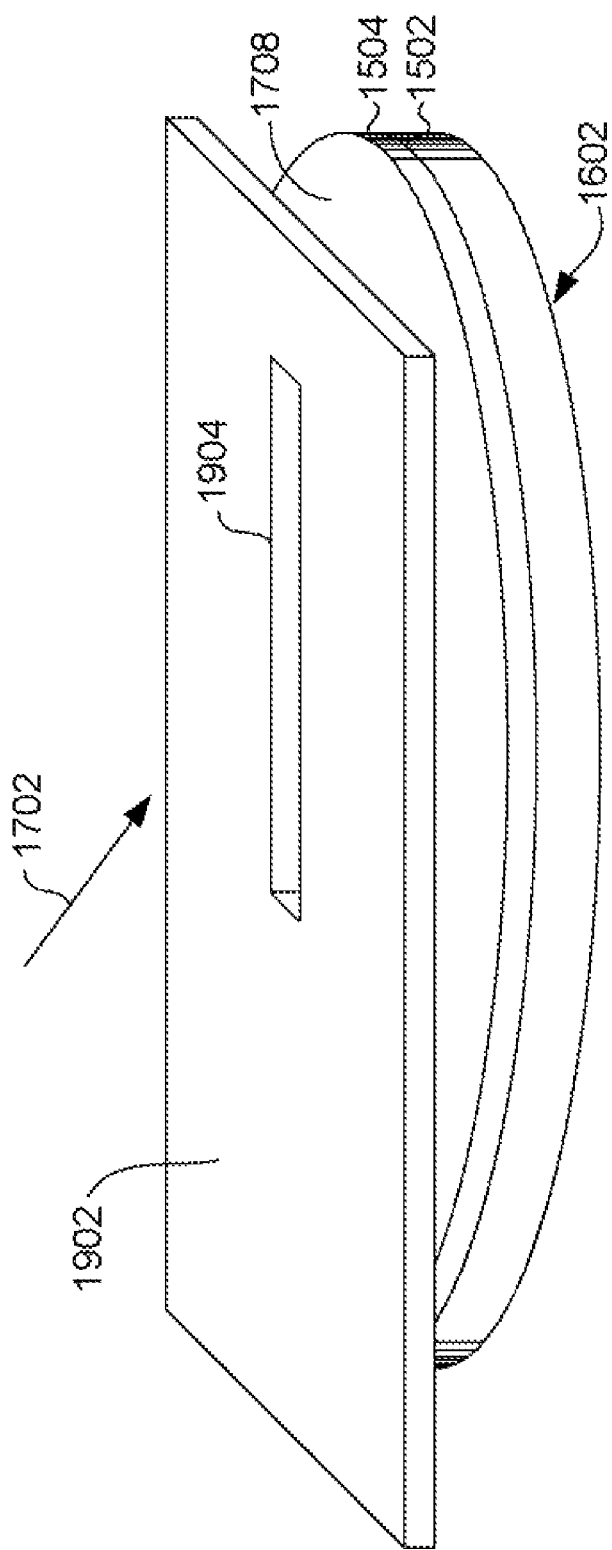

With reference to FIG. 19, in order to milling the soft underlayer 1504 radially as described in FIG. 17, a mask 1902 must be used to limit ion milling to a selected portion of the disk while the disk is spinning. The mask 1902 can have an aperture 1904 which may be in the form of a slit or elongated opening. This aperture 1904 limits the ion beam 1702 to a limited portion of the disk so that the ion milling can be performed in a radial direction on the surface 1708 of the soft underlayer 1504.

Figure 20:
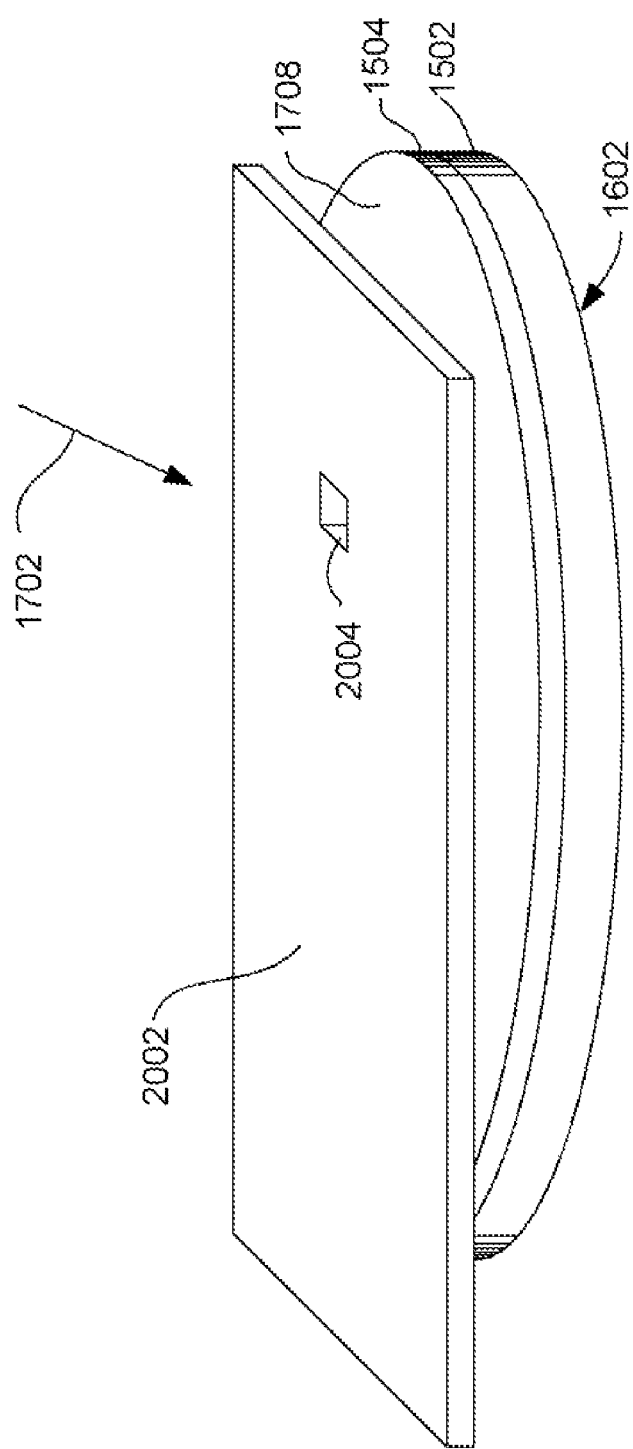

With reference now to FIG. 20, if the ion milling is to be performed in a circumferential direction as described in FIG. 18, a mask 2002 having a smaller aperture 2004 can be used to limit the ion beam 1702 to a relatively small portion of the surface 1708 while the disk 1602 is spinning. This aperture 2004 can be of various configurations. However it should be small enough to sufficiently limit the area over which the ion beam 1702 acts and should be sufficiently large to allow the ion beam 1702 to effectively etch the surface 1708.

It should be pointed out that, while the above described process has been described in terms of a surface treatment of the surface 1708 of the soft magnetic underlayer 1504 other treatment methods could be used as well that fall within the scope of the invention. The treatment could be performed on the underlying layer on which the soft underlayer 1504 is deposited. For example, the surface of the substrate 1502 (FIGS. 17, 18) could be treated by ion milling as described above, and the soft underlayer 1704 could be deposited on that treated surface. The ion milling treatment could be performed on the substrate 1502 itself, or a thin layer of a desired sub-layer material could be deposited on the substrate 1502 and the surface of that thin sub-layer material could be treated by ion milling with the beam 1702. The soft underlayer 1502 could then be deposited over the sub-layer, resulting in a radial magnetic anisotropy in the deposited soft magnetic underlayer 1502.

In addition, since the effectiveness of the surface treatment described above is (after removing a given amount of material) inversely proportional to the remaining thickness of the layer being treated, the soft underlayer could be deposited in steps. For example, a portion of the magnetically soft underlayer 1504 can be deposited, followed by an ion milling with the ion beam 1702, then more of the soft underlayer 1504 deposited followed by another ion milling with the ion beam 1702. This process can be reiterated as many times as necessary to achieve the desired strength of magnetic anisotropy. In addition, the soft underlayer could be deposited as a laminated structure, with many layers of soft magnetic material, each separated by a thin non-magnetic layer such as NiCr, Cr, Rh, Ru, Ta, alumina or some other material. In that case, all or a portion of the deposited magnetic layers or its underlying layer (for example the non-magnetic lamination layers) can be treated by an ion milling with the ion beam 1702. After the soft underlayer 1504 has been deposited by any of the above described methods, a layer of hard magnetic material can be deposited to form the hard magnetic top layer 1506 of the disk 1602.

Figure 21:
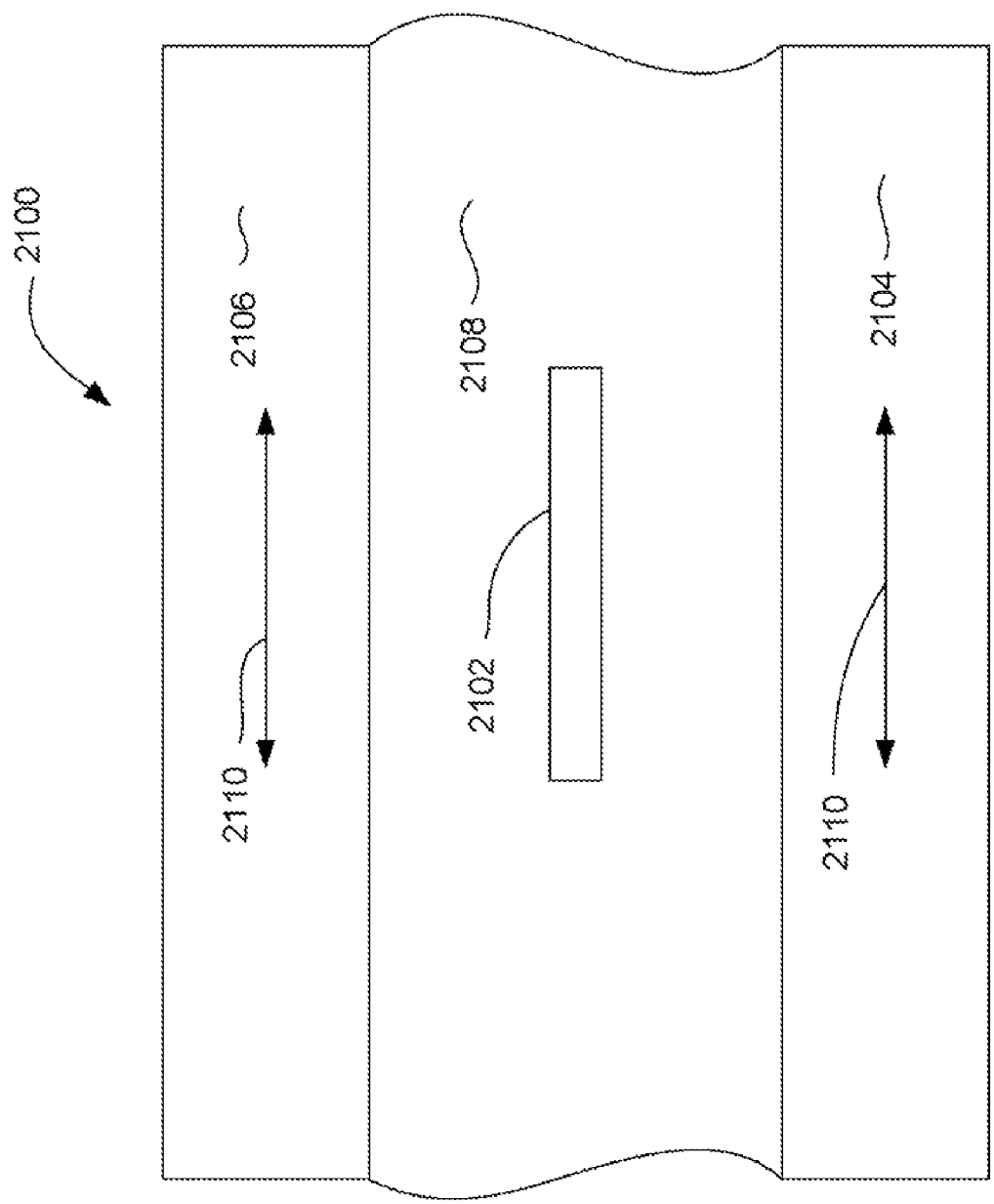
FIG. 21 is an ABS view of a magnetic read head according to an embodiment of the invention.

Magnetic Shields having a Magnetic Anisotropy Induced by Direct Ion Milling:

With reference now to FIG. 21, a magnetic write head 2100 according to an embodiment of the invention as viewed from the direction of a magnetic medium (not shown) (ie. as viewed from the air bearing surface (ABS)) includes a magnetoresistive sensor 1202 and first and second magnetic shields 2104, 2106. The sensor 2102 is sandwiched between the first and second shields 2104, 2106 and is embedded in a dielectric layer 2108.

One or both (preferably both) of the magnetic shields 2104, 2106 have a magnetic anisotropy 2110 that is oriented substantially perpendicular to the track direction and substantially parallel with the medium facing surface or air bearing surface (ABS) of the read head 2100 as shown in FIG. 21. This magnetic anisotropy is created by one or more surface texture treatments that will be described in greater detail herein below.

Figure 22:
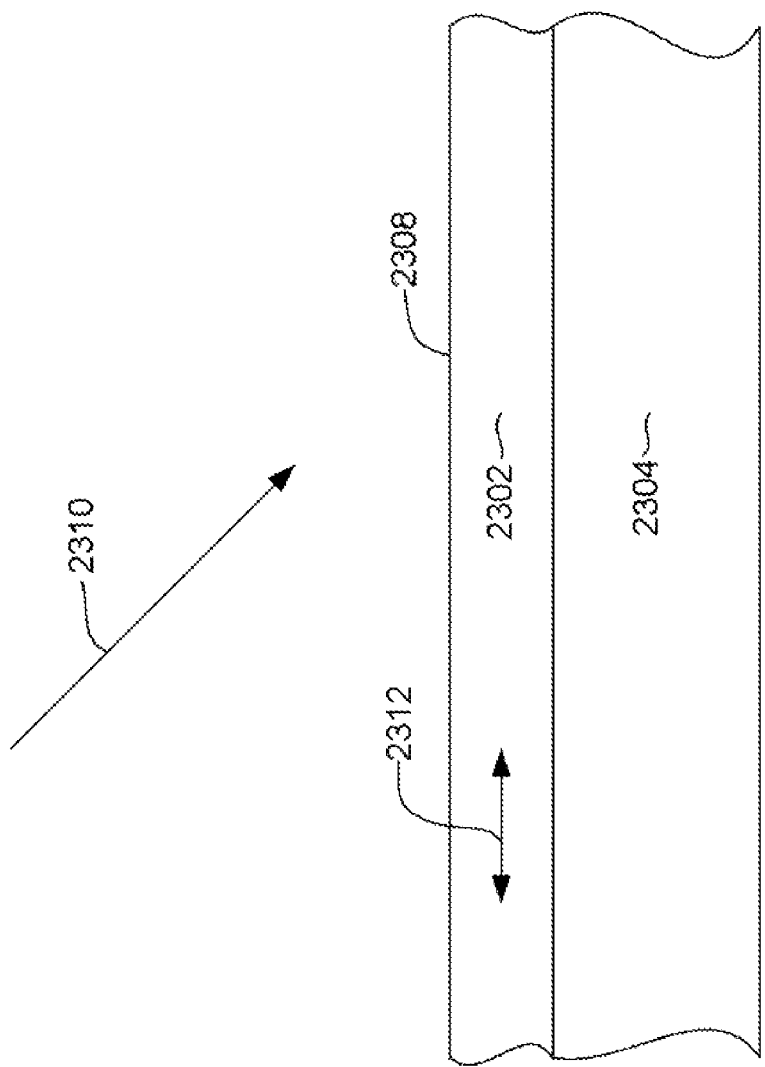
FIGS. 22-26 are views illustrating methods of constructing magnetic shields according to various embodiments of the invention.
Figure 23:
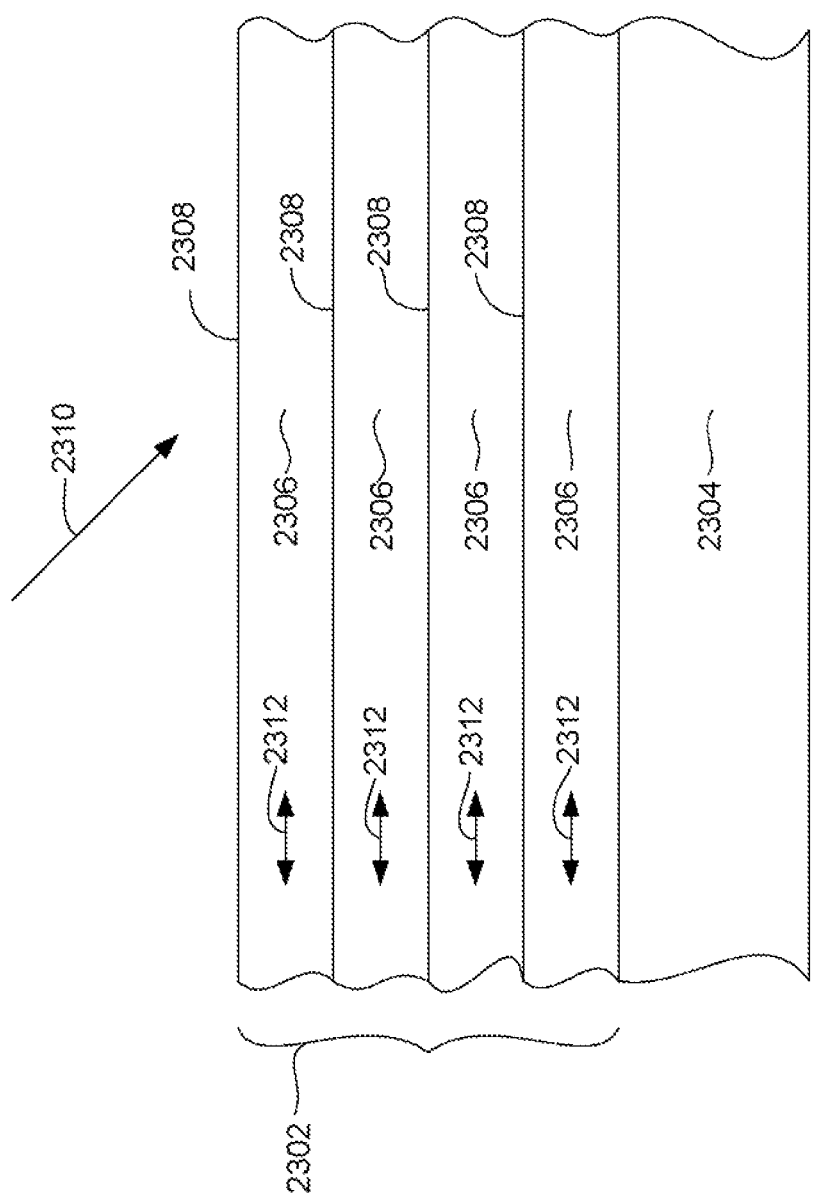

With reference now to FIGS. 22 and 23, in an embodiment of the invention, a magnetic shield structure 2302 is constructed upon a substrate 2304. The substrate 2304 can be a non-magnetic, electrically insulating gap or fill layer such as alumina ($Al_2O_3$) or some other material. As shown in FIG. 23, the shield structure 2302 may include multiple layers of magnetic material 2306 each of which (or a selected portion of which) has a surface 2308 treated with an anisotropic surface texture. The magnetic layers 2306 can be constructed of, for example NiFe or some other magnetic (preferably permeable, low coercivity) material. The shield structure 2302 can be constructed by depositing a magnetic layer 2306, and performing a static angled ion milling with an ion beam 2310 as shown in FIG. 22. Then, another layer of magnetic material 2306 is deposited and another ion milling with an ion beam 2310 is performed on the surface 2308 of that layer. This process is reiterated until a complete shield having a desired magnetic anisotropy 2312 has been constructed.

The treated surfaces 2308 (or interface between the magnetic layers 2306) are provided with the anisotropic surface texture by the angled ion milling with the ion beam 2310. This ion milling procedure and the resulting anisotropic roughness are described in greater detail with reference to FIGS. 5A through 5D. The direction at which the ion milling with the ion beam 2310 is performed and the orientation of the resulting anisotropic roughness depends upon the material composition used to construct the magnetic layers 2306 as well as possibly other factors such as the ion beam energy or substrate temperature. However, the direction of the ion milling with the ion beam 2310 and resulting surface texture are chosen so as to induce a magnetic anisotropy 2312 in the magnetic layers 2306 in a direction substantially parallel with the air bearing surface (ABS) and substantially perpendicular to the write track direction.

Figure 24:
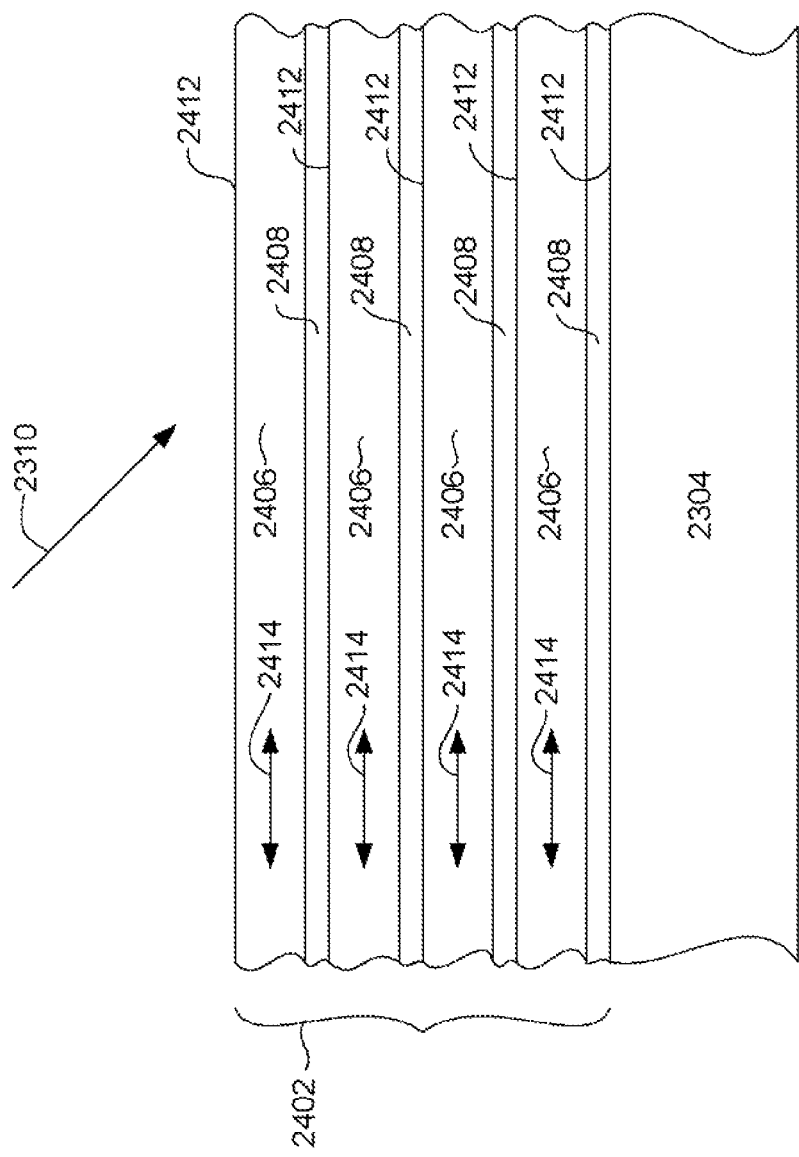

With reference now to FIG. 24, in another possible embodiment of the invention, a magnetic shield structure 2402 constructed upon a substrate 2304 includes multiple layers 2406 of magnetic material separated by thin layers of non-magnetic material 2408. In this laminated shield structure 2402 the magnetic layers 2406 may be constructed of NiFe or some other magnetic material. The non-magnetic lamination layers 2408 may be constructed of, for example NiCr, Cr, Rh, Ru, alumina, Ta, or some other non-magnetic material and may be electrically conductive or electrically insulating as desired. The magnetic layers 2406 each have a surface 2412 treated with an anisotropic roughness that induces a magnetic anisotropy 2414 in the magnetic layers 2406. The anisotropically textured surfaces (or interfaces between the magnetic layers 2406 and non-magnetic layers 2408) can be treated by an ion milling with an ion beam 2310 oriented in such a manner as to create the desired magnetic anisotropy 2414 in the magnetic layers 2406. As mentioned above, the ion milling is described in greater detail with reference to FIGS. 5A-5D. Although the ion milling is shown as being performed on the top magnetic layer 2406, it should be understood that the ion milling can be performed on each (or a selected number) of the magnetic layers 2406 prior to depositing the subsequent non-magnetic layer 2408.

The laminated structure of the shield 2402 advantageously prevents the formation of domains in the shield 2402, and also increases the effective anisotropy 2414 by providing an anti-parallel coupling between the magnetic layers 2406. The effectiveness of the milling induced surface treatment of a magnetic layer in creating a magnetic anisotropy in the magnetic layer (after removing a given amount of material) is inversely proportional to the remaining thickness of the magnetic layer being treated. Therefore, by creating multiple magnetic layers and multiple surface treatments, the amount of magnetic anisotropy 2414 for the magnetic shield is increased dramatically. This benefit applies to the structure described with reference to FIG. 23 as well as the embodiment described with reference to FIG. 24.

While the embodiment described with reference to FIG. 24 has been described as having the surface of each of the magnetic layers 2408 treated by ion milling, it should be pointed out that in addition to or in lieu of treating the surface 2412 of the magnetic layers, the surface of the non-magnetic layer 2408 can be treated as well. In that case, the treatment of the surface of the non-magnetic layer creates an anisotropic texture in the surface of the non-magnetic layer 2408 that induces a magnetic anisotropy in the magnetic layer 2406 deposited there over.

Figure 25:
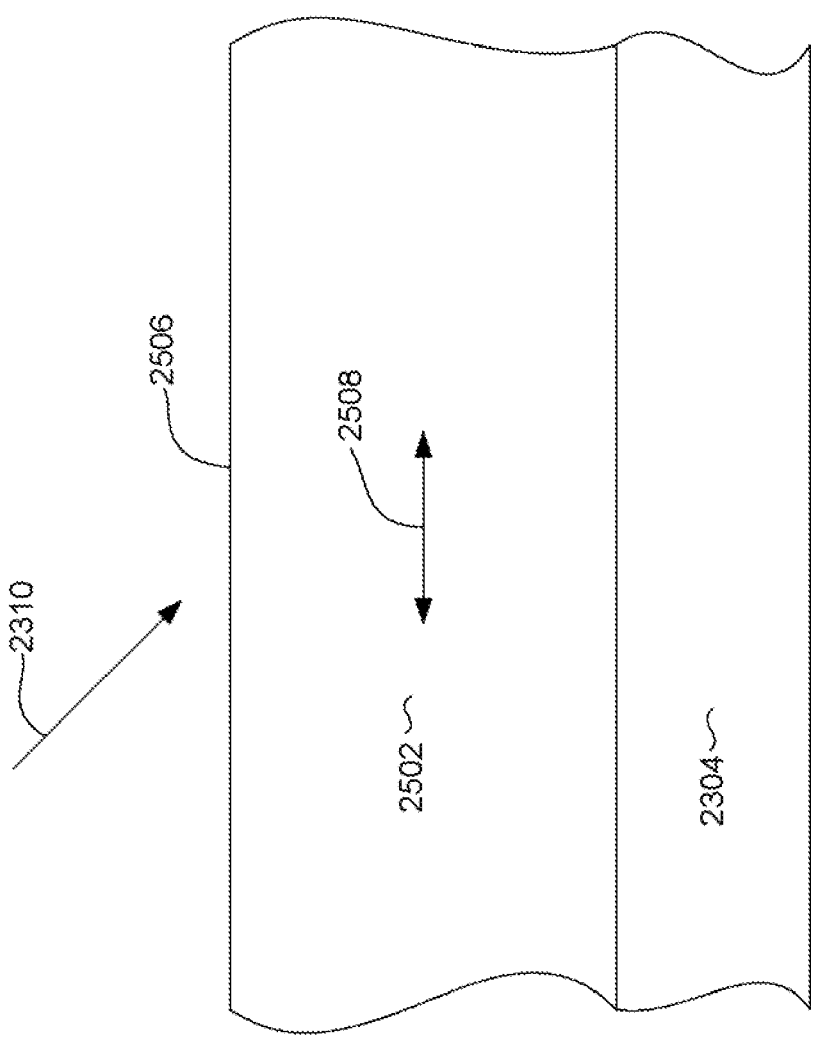

With reference now to FIG. 25, another embodiment of the invention includes a single layer shield 2502 formed over the substrate 2304. The magnetic shield 2502 can be constructed of a magnetic material such as NiFe or some other material and has a surface 2506 that has been treated by an angled ion milling to provide it with an anisotropic texture. As with the previously described embodiments, the ion milling and resulting surface texture are chosen to induce a magnetic anisotropy 2508 that is oriented substantially perpendicular to the track direction and substantially parallel with the ABS. Also as with the previously described embodiments the ion milling and resulting surface texture are described in greater detail in FIGS. 5A through 5D. Also, in addition to, or in lieu of, treating the surface 2506 of the magnetic shield 2502 with the ion milling, a similar ion milling can be performed on the underlying substrate to create an anisotropic surface texture in the substrate 2304 that will induce a desired magnetic anisotropy in the later deposited shield 2502.

Figure 26:
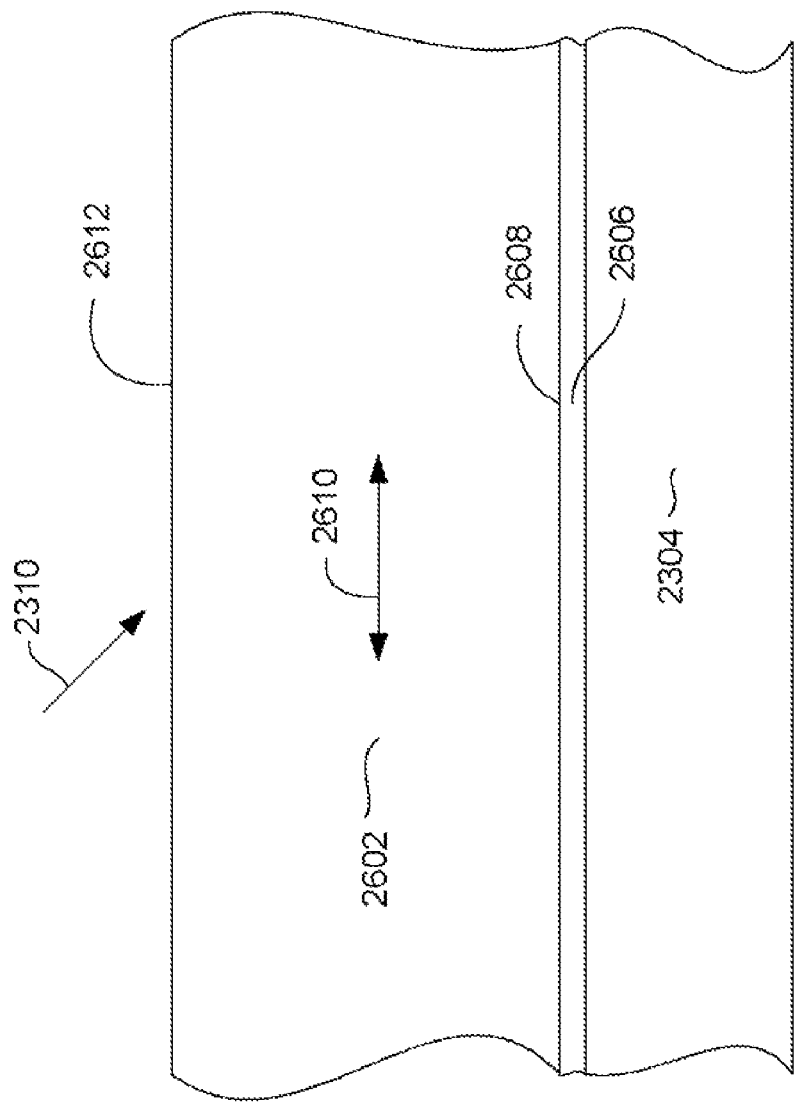

With reference now to FIG. 26, a magnetic shield 2602 can be constructed upon an underlayer 2606 over a substrate 2304. Again the shield 2602 is constructed of a magnetic material such as NiFe, and the substrate 2304 can be alumina or some other material. The underlayer 2606 has a surface 2608 (interface between the underlayer 2606 and shield 2602) that has been treated by an ion beam 2310 to give it an anisotropic surface texture. The underlayer 2606 is constructed of a material such as NiFeCr, NiCr, Rh, Ta, Ru that is chosen to induce a strong magnetic anisotropy 2610 in the magnetic shield 2602. The surface 2608 can be treated by an ion milling as described with reference to FIGS. 5A through 5D. In addition to treating the surface 2608 of the underlayer 2606, the surface 2612 of the shield 202 can be similarly treated by an ion milling to create an anisotropic surface texture that will increase the magnetic anisotropy 2610 in the shield 2602.

Uncontrolled domain structures in magnetic shields cause unwanted noise and performance issues in shielded magnetic sensors. The magnetic anisotropy provided by the present invention inhibits the formation of these undesirable domain structures in the shields, thereby increasing the performance of the shields. The present invention provides a desired magnetic anisotropy without increasing the coercivity of the shield. It has been found that providing a magnetic anisotropy in a magnetic shield, especially in the initial layers of the shield, decreases noise in the sensor. Also, creating a magnetic anisotropy in the shield prevents the shield from becoming saturated in the pole direction (perpendicular to the medium), thereby preventing the shield from erasing data from the magnetic media.

Figure 27:
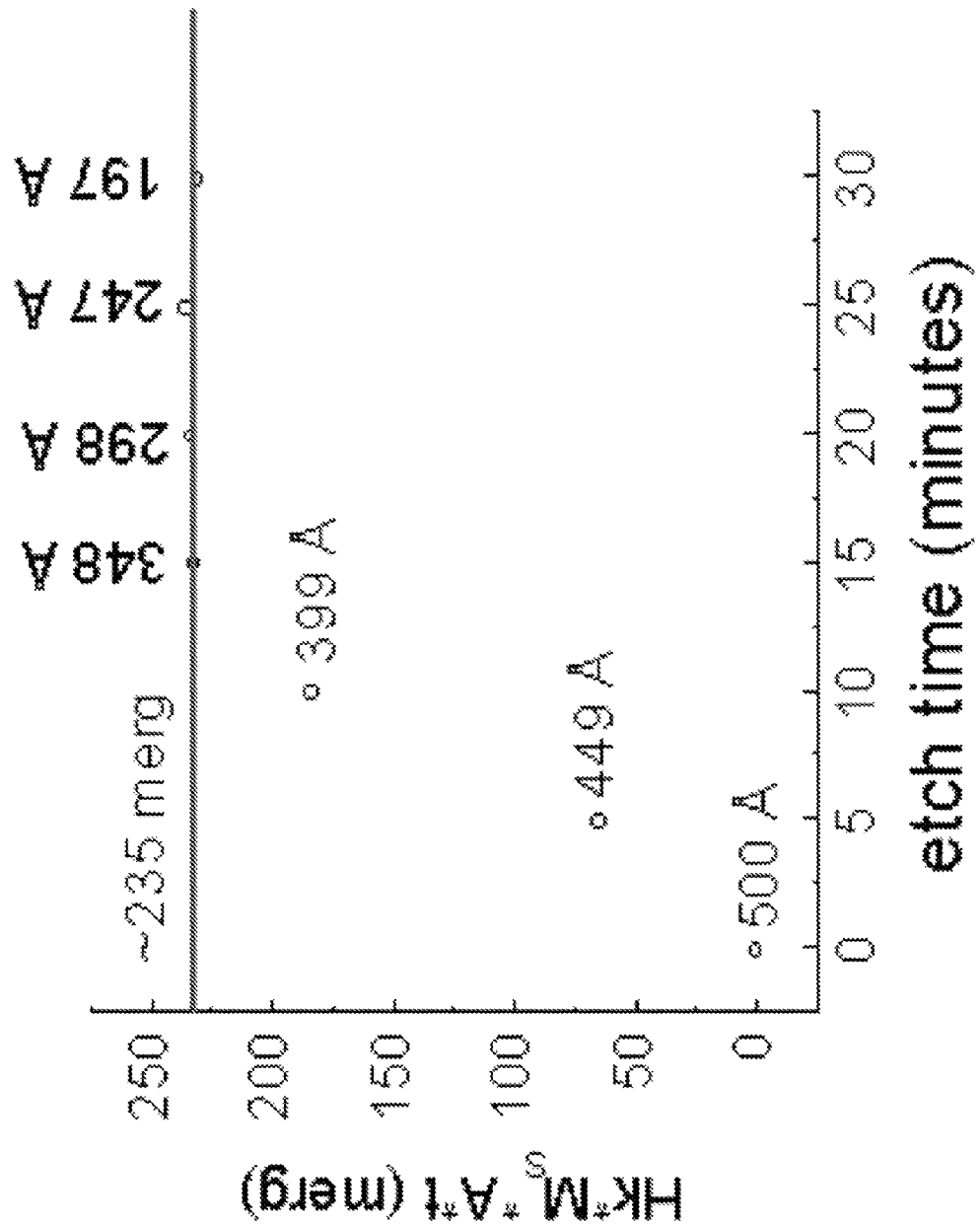
FIG. 27 is a graphical representation illustrating a relationship between etching time and magnetic anisotropy.
Figure 28:
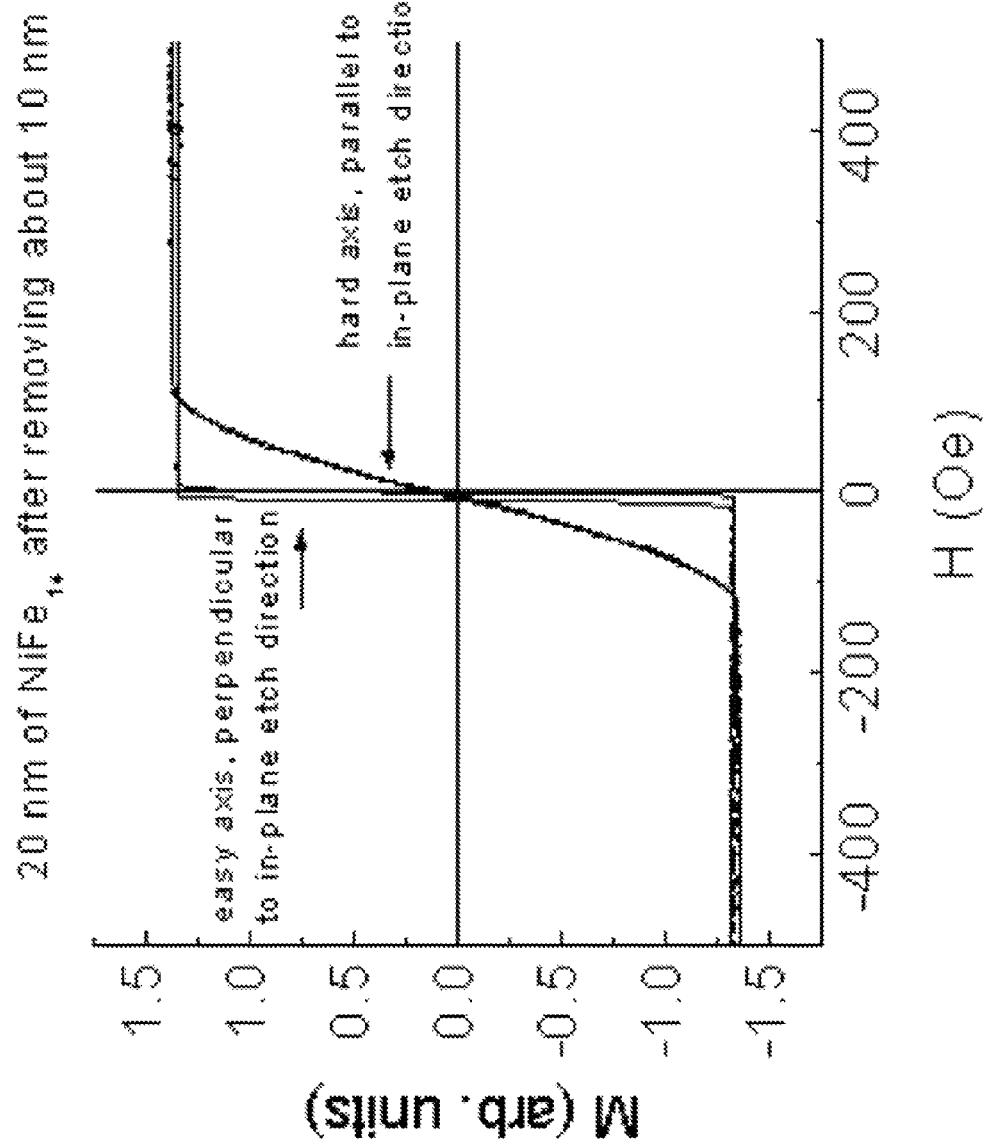
FIG. 28 is a graphical representation illustrating a magnetic anisotropy provided by the present invention.
Figure 29:
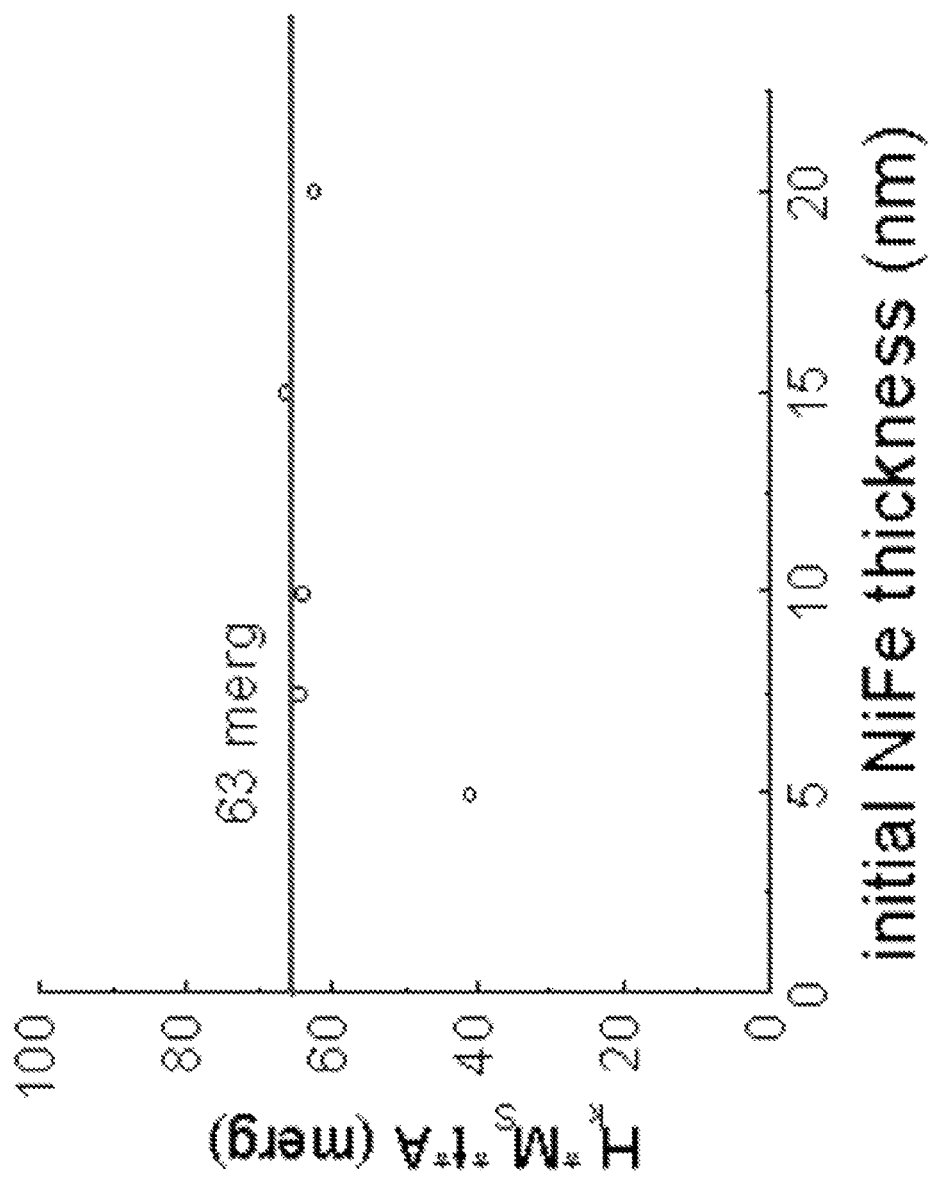
FIG. 29 is a graphical illustration of a relationship between thickness and anisotropy.

With reference now to FIGS. 27-29, the effect of ion milling on magnetic anisotropy can be seen more clearly. FIGS. 27-29 illustrate the anisotropy energy created by milling an initially 500 Angstrom thick $NiFe_{14}$ film. As can be seen with reference to FIG. 27 the effect of ion milling saturates after about 15 minutes, or after about 150 Angstroms have been removed. This further shows that after removing sufficient magnetic material (in the case of NiFe about 150 Å) the etch induced anisotropy behaves as a surface anisotropy since the anisotropy field $H_K$ scales with the inverse thickness t of the remaining magnetic layer material. With reference to FIG. 29, the anisotropy energy for a given milling time (here 5 minutes) is constant regardless of the initial magnetic film thickness, except if the final film thickness becomes too thin (which is here the case if the initial $NiFe_{14}$ film thickness is 5 nm).

Use of Anisotropic Etching in a Magnetic Random Access Memory (MRAM) Array:

The desired characteristics of a memory system for computer main memory are high speed, low power, non-volatility, and low cost. Low cost is accomplished by a simple fabrication process and a small surface area. Dynamic random access memory (DRAM) cells are fast and expend little power, but have to be refreshed many times each second and require complex structures to incorporate a capacitor in each cell. Flash type EEPROM cells are non-volatile, have low sensing power, and can be constructed as a single device, but take microseconds to write and milliseconds to erase, which makes them too slow for many applications, especially for use in computer main memory. Conventional semiconductor memory cells such as DRAM, ROM, and EEPROM have current flow in the plane of the cell, i.e., "horizontal", and therefore occupy a total surface area that is the sum of the essential memory cell area plus the area for the electrical contact regions, and therefore do not achieve their theoretical minimum cell area.

Unlike DRAM, a magnetic memory cell that stores information as an orientation of magnetization of a ferromagnetic region can hold stored information for long periods of time, and is thus non-volatile. A magnetic memory cell that uses the magnetic state to alter the electrical resistance of the materials near the ferromagnetic region can be described as a magnetoresistive (MR) memory cell. An array of magnetic memory cells can be called magnetic RAM or MRAM.

Although many types of MR cells could been used in an MRAM array, magnetic tunnel junction sensors (MTJ), also called tunnel valves, are preferable, although other magnetic memory cells such as current perpendicular to plane giant magnetoresistive (CPP GMR) cells can be used as well.

Figure 30:
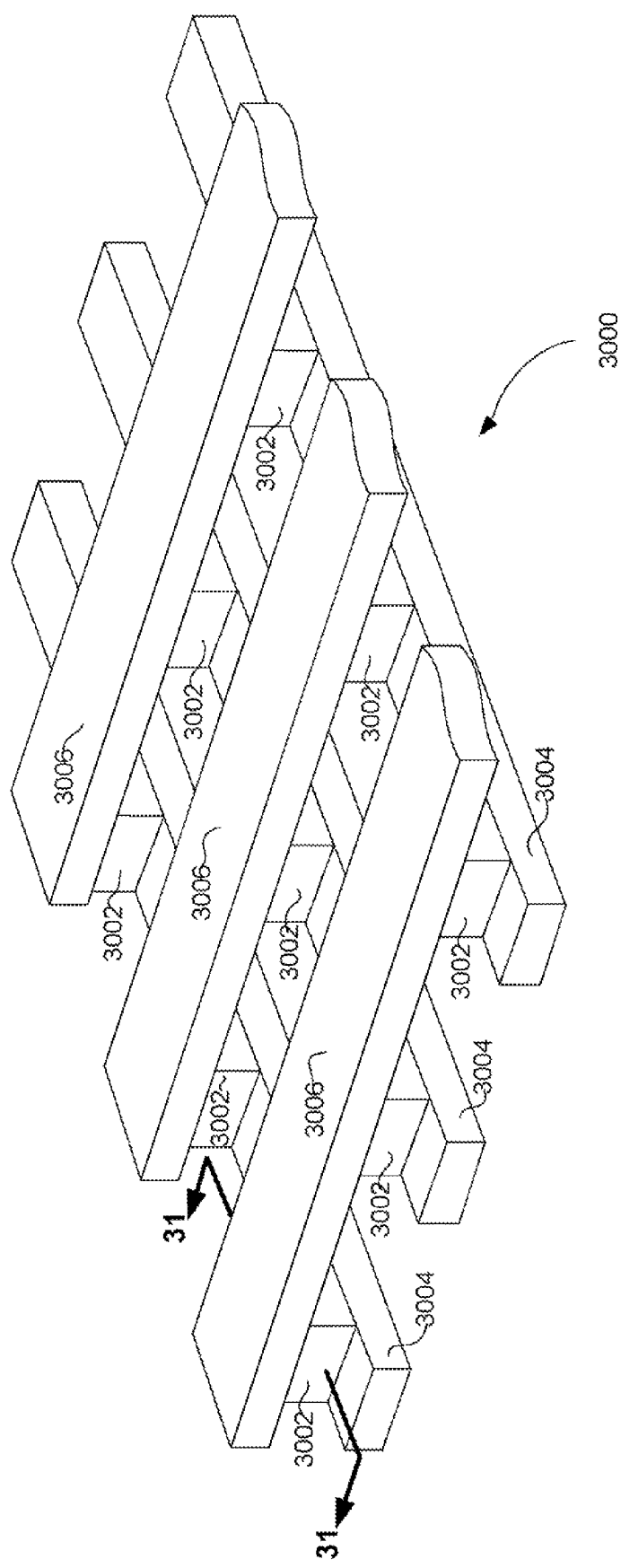
FIG. 30 is a perspective schematic view of a Magnetic Random Access Memory (MRAM) array.

With reference now to FIG. 30, a magnetic random access memory array 3000 includes a plurality of memory cells 3002 positioned at intersections of an exemplary rectangular grid of electrically conductive word lines 3004 and bit lines 3006. The word lines 3004 are arrayed as parallel lines in a first plane, and the bit lines 3006 are arrayed in parallel lines, perpendicular to the word lines in a second plane. Each magnetic memory call 3002 connects one word line 3004 with a bit line 3006, bridging the space between the planes of the word lines and bit lines at the intersection of the word and bit line 3004, 3006. Although three word lines and three bit lines are shown in FIG. 2, this is for purposes of illustration only and the actual number of word lines 304, bit lines 3006 and magnetic memory cells 3002 would be much larger.

During a sensing or reading operation of the array, current flows in a vertical direction through the cell 3002. The vertical current path through the cell 3002 permits the magnetic memory cell to occupy a very small surface area. The array may be formed on a substrate (not shown), which contains other circuitry. The magnetic memory cell is a magnetoresistive cell that has high and low resistance states (i.e. on and off) that correlate to the magnetic state of layers within the sensor. The memory state of the sensor 3002 can be switched by conducting a current through the word and bit lines 3004, 3006 associated with a particular memory cell 3002 to thereby cause magnetic fields to emanate from the particular word and bit lines 3004, 3006. This switching process will be discussed in more detail below after further discussion of the structure of the cell 3002.

With reference now to FIG. 31, a magnetic memory cell 3100 according to an embodiment of the invention is sandwiched between a word line 3112 and a bit line 3114. The bit line 3114 is shown in cross section in FIG. 31 and would extend into and out of the plane of the page.

The memory cell includes first and second magnetic layers 3102 and 3106. A non-magnetic layer 3110 is sandwiched between the first and second magnetic layers 3102, 3106, and may be a non-magnetic, electrically insulating barrier layer (if the cell 3100 is a tunnel valve) or a non-magnetic, electrically conductive spacer layer (if the cell 3100 is a CPP GMR sensor).

The first magnetic layer 3102 has a magnetization 3116 that is pinned in a desired direction. This first magnetic layer 3102 can therefore, be referred to as a pinned layer. The pinned layer can be a laminated structure such as an antiparallel-coupled pinned layer structure, such as FM1/AFC/FM2, where FM1 and FM2 are two ferromagnetic layers such as CoFe or NiFe and AFC is an anti-parallel coupling layer such as Ru, Ir, Cr, or Rh. The second magnetic layer 3106 has a magnetization 3118 that can move between two stable states either parallel (as shown) or anti-parallel with the magnetization 3116 of the pinned layer 3102. This second magnetic layer 3106 can, therefore, be referred to as a free layer. Pinning of the magnetization 3116 of the pinned layer 3102 can be maintained by an exchange field caused by exchange coupling of the pinned layer 3102 with a layer of antiferromagnetic material AFM layer 3104.

The AFM layer 3104 can be constructed of PtMn, IrMn or some other antiferromagnetic material. The first and second magnetic layers 3102, 3106 can be constructed of a magnetic material such as CoFe, NiFe or some combination of these or other materials. The non-magnetic layer 3110 can be alumina ($Al_2O_3$), magnesium oxide ($MgO_x$), titanium oxide ($TiO_x$), or some other electrically insulating material (if the cell 3100 is a tunnel valve) or can be an electrically conductive material such as Cu (if the cell 3100 is a CPP-GMR sensor). The word and bit lines 3112, 3114 can be constructed of Cu, Au, or some other electrically non-magnetic material.

Alternatively to a pinned layer exchanged coupled to an AFM layer, the first magnetic layer 3102 may be a magnetic layer exhibiting much larger coercivity than the second magnetic layer 3106, for example $Co_{1-x}Pt_x$ (8<x<30 at %). In that case layer 3104 may be an underlayer such as Cr, CrV, CrTi, or CrMo.

With continued reference to FIG. 31, the cell 3100 functions based on the spin dependent tunneling (in the case of a tunnel valve) or spin dependent scattering (in the case of a GMR sensor) of electrons through the non-magnetic barrier/spacer layer 3110. When the magnetizations 3116, 3118 of the pinned layer 3102 and free layer 3106 are parallel to one another (ie. in the same direction) electrical current can flow relatively freely through the cell 3100 from between the word and bit lines 3112, 3114. In this state the cell 3100 is considered to be in the "on" state. when the magnetizations 3116, 3118 are antiparallel to one another (ie. in opposite directions) the flow of current through the cell 3100 is restricted and the cell 3100 is considered to be in the "off" state.

In order to flip the magnetization of the free layer 3106 from one orientation to another current can be caused to flow through the word and bit lines 3112, 3114. For example, if the magnetization 3118 of the free layer 3106 is initially oriented as shown in FIG. 31, a current 3120 through the word line 3112 creates a magnetic field 3122 about the word line 3112. This magnetic field causes the magnetization 3118 of the free layer 3106 to rotate from its initial orientation. An electrical current 3124 (shown as into the page in FIG. 31) creates a magnetic field 3126 about the bit line 3114. This magnetic field 3114 completes the switching of the magnetization 3118 of the free layer, causing the magnetization 3118 to switch (in this illustrative case) to the left rather than to the right.

As can be appreciated, some mechanism is needed to cause the magnetization 3118 of the free layer 3106 to be stable in either the "off" or "on" state (ie. to the right or to the left), while still allowing the magnetization 3118 to be free to rotate from one state to the other. To meet this need, the free layer has a magnetic anisotropy 3128. This magnetic anisotropy is generated, at least in large part, by an anisotropic roughness.

The free layer 3106 has a surface 3130, which can be treated by an angled, direct ion milling that produces an anisotropic surface roughness or texture (not shown in FIG. 31). This anisotropic surface texture induces a uniaxial magnetic anisotropy 3128 in the free layer 3106 in a desired direction parallel with the magnetization 3116 of the pinned layer 3116. This direct angled ion milling and the resulting anisotropic surface texture or roughness is descried in much greater detail with reference to FIGS. 5A-5D, wherein the layer 502 corresponds to the free layer 3106 in FIG. 31.

Alternatively, rather than treating the surface of free layer 3106 with the angled direct ion milling described above, the surface of the underlying barrier/spacer layer 3110 can be treated with the angled ion milling described in FIGS. 5A-5D. In this case, the layer 502 described in FIGS. 5A-5D corresponds to the barrier spacer layer 3110 in FIG. 31. The resulting anisotropic surface roughness of the surface 3132 of the barrier/spacer layer 3110 results in a desired magnetic anisotropy in the later deposited free layer 3106.

In addition to the magnetic anisotropy 3128 of the free layer 3106, the pinned layer 3102 can be treated in a similar manner to give it a magnetic anisotropy that is also parallel with the magnetic anisotropy 3128 of the free layer 3106. This can be accomplished by treating the surface of the pinned layer 3102 as described in FIGS. 5A-5D to create an anisotropic surface texture or by treating the surface of the AFM layer 3104 as described in FIGS. 5A-5D to create an anisotropic surface texture on the surface of the AFM layer 3104. If the pinned layer is laminated such as an FM1/AFC/FM2 the top surface of each FM1, AFC, FM2 can be treated as described in FIGS. 5A-5D to create an anisotropic surface texture.

Alternatively, if the first magnetic layer 3102 is a hard magnetic layer such as $Co_{1-x}Pt_x$ (8<x<30 at %), the surface of the underlayer 3104 can be treated as described in FIGS. 5A-5D to create an anisotropic surface texture on the surface of the underlayer layer 3104.

While various embodiments have been described above, it should be understood that they have been presented by way of example only, and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A method for manufacturing a magnetically anisotropic magnetic layer, comprising:
   providing a substrate;
   depositing a magnetic layer over the substrate;
   depositing a sacrificial layer on the magnetic layer; and
   performing an ion milling on the sacrificial layer until the magnetic layer has been exposed, the ion milling being performed at an angle relative to a normal to a surface of the magnetic layer in order to form an anisotropic surface texture on the magnetic layer.

2. The method as in claim 1 further comprising, while performing the ion milling, detecting removal of the sacrificial layer, and terminating the ion milling when the sacrificial layer has been removed.

3. The method as in claim 1 further comprising, while performing the ion milling, using an etch detector to detect removal of the sacrificial layer, and terminating the ion milling when the sacrificial layer has been removed.

4. The method as in claim 1 further comprising, while performing the ion milling, using a secondary ion mass spectrometer to detect removal of the sacrificial layer, and terminating the ion milling when the sacrificial layer has been removed.

5. The method as in claim 1 wherein the ion milling is performed without rotation of the magnetic layer relative to the ion beam.

6. The method as in claim 1 wherein the ion milling is performed at an energy of 80 to 120 eV.

7. The method as in claim 1 wherein the angled ion milling is performed at an angle of 25-65 degrees relative to normal.

8. The method as in claim 1 wherein the angled ion milling is performed at an angle of 20-80 degrees relative to normal.

9. The method as in claim 1 wherein the anisotropic surface texture induces a magnetic anisotropy in the magnetic layer.

10. The method as in claim 1, wherein the sacrificial layer is a material that is different from the magnetic layer.

11. A method for manufacturing a magnetically anisotropic magnetic layer, comprising:
    providing a substrate;
    depositing a magnetic layer over the substrate;
    depositing an indicator layer on the magnetic layer;
    depositing a sacrificial layer on the indicator layer; and
    performing an ion milling on the sacrificial layer, the ion milling being performed at an angle relative to a normal to a surface of the magnetic layer to form an anisotropic surface texture that induces a magnetic anisotropy in the magnetic layer.

12. The method as in claim 11 wherein the ion milling is performed until the indicator layer has been reached.

13. The method as in claim 11 wherein the ion milling is performed until the indicator layer has been removed.

14. The method as in claim 11 wherein the anisotropic surface texture is formed in the surface of the magnetic layer.

15. The method as in claim 11 further comprising, while performing the ion milling, detecting the material removal to determine when the indicator layer has been reached.

16. The method as in claim 11 further comprising, while performing the ion milling, using an etch detector to determine when the indicator layer has been reached.

17. The method as in claim 11 further comprising, while performing the ion milling, using a secondary ion mass spectrometer to determine when the indicator layer has been reached.

18. The method as in claim 11 wherein the indicator layer comprises a material selected from the group consisting of Ta, Ru, Pt, Cr, Pd, Ti and Al.

19. The method as in claim 11 wherein the sacrificial layer comprises a material selected from the group consisting of Ru, Ta, Au, Cu and Ag.

20. The method as in claim 11 wherein the ion milling is performed at an energy of 80 to 120 eV 21. The method as in claim 11 wherein the angled ion milling is performed at an angle of 25-65 degrees relative to normal.

22. The method as in claim 11 wherein the angled ion milling is performed at an angle of 20-80 degrees relative to normal.

23. The method as in claim 11 wherein the ion milling is performed without rotating the magnetic layer.

24. The method as in claim 11 wherein the indicator layer is a material that is more resistant to ion milling than the sacrificial layer and wherein the indicator layer acts as a milling stop.

* * * * *